US 9,755,678 B2

(12) United States Patent
Selvanayagam et al.

(10) Patent No.: US 9,755,678 B2
(45) Date of Patent: Sep. 5, 2017

(54) LOW NOISE TRANSCONDUCTANCE AMPLIFIERS

(71) Applicant: ANALOG DEVICES GLOBAL, Hamilton (BM)

(72) Inventors: Sivanendra Selvanayagam, Abingdon (GB); Shane A. O'Mahony, Grenagh (IE); Michael J. Deeney, Cork (IE); Niall Kevin Kearney, Cork (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/956,257

(22) Filed: Dec. 1, 2015

(65) Prior Publication Data

US 2017/0155414 A1    Jun. 1, 2017

(51) Int. Cl.
  *H04B 1/12* (2006.01)
  *H03F 1/02* (2006.01)
  *H03F 3/193* (2006.01)

(52) U.S. Cl.
  CPC ........... *H04B 1/126* (2013.01); *H03F 1/0205* (2013.01); *H03F 3/193* (2013.01); *H03F 2200/294* (2013.01); *H03F 2200/451* (2013.01)

(58) Field of Classification Search
  CPC ....... H04B 1/126; H03F 1/0205; H03F 3/193; H03F 220/294; H03F 220/451
  See application file for complete search history.

(56) References Cited

U.S. PATENT DOCUMENTS

| 6,029,052 | A  | 2/2000  | Isberg et al.  |
|-----------|----|---------|----------------|
| 6,433,638 | B1 | 8/2002  | Heineke et al. |
| 6,675,003 | B1 | 1/2004  | Dubash et al.  |
| 6,882,229 | B1 | 4/2005  | Ho et al.      |
| 7,598,787 | B2 | 10/2009 | Kim            |
| 7,656,230 | B2 | 2/2010  | Fagg           |
| 7,821,315 | B2 | 10/2010 | Bossu et al.   |
| 7,865,164 | B2 | 1/2011  | Xu et al.      |
| 8,045,943 | B2 | 10/2011 | Kaczman et al. |

(Continued)

FOREIGN PATENT DOCUMENTS

| DE | 202014105774 | 3/2015 |
|----|--------------|--------|
| JP | 2007 243946  | 9/2007 |

(Continued)

OTHER PUBLICATIONS

Cetinkaya, Hakan, "Design of LNTA for Multi-Band WCDMA", Thesis submitted in partial fulfillment of the degree of Master of Science in Microelectronics, Delft University of Technology, Sep. 2010, 123 pages.

(Continued)

*Primary Examiner* — Janice Tieu
(74) *Attorney, Agent, or Firm* — Knobbe, Martens, Olson & Bear, LLP

(57) ABSTRACT

Provided herein are apparatus and methods for transconductance amplifiers, such as split cascode low-noise transconductance amplifiers (LNTAs). In an embodiment, an LNTA includes split current paths each coupled to a different mixer by way of a different alternating current (AC) coupling capacitor. The split current paths of the LNTA can be enabled during different modes of operation, such as when the input to the LNTA is within different frequency bands.

20 Claims, 14 Drawing Sheets

(56) References Cited

U.S. PATENT DOCUMENTS

| | | | |
|---|---|---|---|
| 8,073,078 B2* | 12/2011 | Kaczman | H04L 27/3863 330/250 |
| 8,248,161 B2* | 8/2012 | Syed | H03F 1/26 330/253 |
| 8,433,272 B2 | 4/2013 | Gudem et al. | |
| 8,461,901 B1 | 6/2013 | Morton et al. | |
| 8,472,890 B2 | 6/2013 | Zhuo et al. | |
| 8,571,510 B2 | 10/2013 | Liu et al. | |
| 8,712,357 B2 | 4/2014 | Panikkath et al. | |
| 8,717,077 B2 | 5/2014 | Panikkath et al. | |
| 8,718,574 B2 | 5/2014 | Panikkath et al. | |
| 8,791,740 B2 | 7/2014 | Qiao et al. | |
| 8,854,098 B2 | 10/2014 | Yang et al. | |
| 8,983,413 B2 | 3/2015 | Herzinger et al. | |
| 9,008,592 B2 | 4/2015 | Mirzaei et al. | |
| 9,088,253 B2 | 7/2015 | Kwon | |
| 2002/0042255 A1 | 4/2002 | Prentice | |
| 2003/0064699 A1 | 4/2003 | Olsen | |
| 2006/0189286 A1 | 8/2006 | Kyu et al. | |
| 2008/0020728 A1 | 1/2008 | Zhuo et al. | |
| 2009/0088124 A1 | 4/2009 | Schuur et al. | |
| 2009/0124223 A1 | 5/2009 | Kyranas et al. | |
| 2009/0284288 A1 | 11/2009 | Zhang et al. | |
| 2010/0041360 A1 | 2/2010 | Camp, Jr. et al. | |
| 2010/0079182 A1 | 4/2010 | Lien et al. | |
| 2010/0120390 A1 | 5/2010 | Panikkath et al. | |
| 2011/0128999 A1 | 6/2011 | Ruegamer et al. | |
| 2011/0244820 A1* | 10/2011 | Khoini-Poorfard | H04B 1/30 455/255 |
| 2012/0326754 A1 | 12/2012 | Hadji-Abdolhamid et al. | |
| 2013/0231064 A1 | 9/2013 | Gudem et al. | |
| 2013/0315348 A1 | 11/2013 | Tasic et al. | |
| 2014/0179251 A1 | 6/2014 | Persico et al. | |
| 2014/0375363 A1 | 12/2014 | Chen et al. | |
| 2016/0087587 A1 | 3/2016 | Wang et al. | |

FOREIGN PATENT DOCUMENTS

| | | |
|---|---|---|
| JP | 2008 099227 | 4/2008 |
| WO | WO 00-41325 | 7/2000 |
| WO | WO 2006-032932 | 3/2006 |
| WO | WO 2009-003101 | 12/2008 |
| WO | WO 2012 158429 | 11/2012 |

OTHER PUBLICATIONS

Kim, Ju Sung, "Broadband RF Front-End Design for Multi-Standard Receiver with High-Linearity and Low-Noise Techniques", A Dissertation, Submitted to the Office of Graduate Studies of Texas A & M University in partial fulfillment of the requirements for the degree of Doctor of Philosophy, Dec. 2011, 134 pages.

Analog Devices, Inc., "High Performance, Low Power, 169 MHz ISM Band, Radio Transceiver IC", ADF7030 Data Sheet, Rev, 0, Jul. 2015, pp. 1-24. Available at: http://www.analog.com/media/en/technical-documentation/data-sheets/ADF7030.pdf (accessed Dec. 30, 2015).

Kaczman, Daniel, et al., "A Single-Chip 10-Band WCDMA/HSDPA 4-Band GSM/EDGE SAW-less CMOS Receiver With DigRF 3G Interface and πdBm IIP2", IEEE Journal of Solid-State Circuits, vol. 44, No. 3, Mar. 2009, pp. 718-739.

Redman-White, W., et al., "1/f Noise in Passive CMOS Mixers for Low and Zero IF Integrated Receivers," Solid-State Circuits Conference 2001, 4 pages.

Tenbroek, Bernard, et al., "Single-Chip Tri-Band WCDMA/HSDPA Transceiver without External Saw Filters and with Integrated TX Power Control", IEEE International Solid-State Circuits Conference 2008, pp. 202-203 and 607.

Borremans, et al., "A Switchable Low-Area 2.4-and-5 GHz Dual-Band LNA in Digital CMOS," IEEE 33$^{rd}$ European Solid State Circuits Conference, Sep. 2007, pp. 376-379.

Kearney, et al., "A 160-to-960MHz ETSI Class-1-Compliant to IoE Transceiver with 100dB Blocker Rejection, 7OdB ACR and 800 pA Standby Current," ISSCC 2016, Feb. 3, 2016.

European Search Report dated Apr. 6, 2017 for European Patent Application No. 16201492.2, 8 pages.

Park, Jaewoo, et al., "A Direct-Conversion CMOS RF Receiver Reconfigurable from 2 to 6 GHz", IEEE Transaction on Microwave Theory and Techniques, vol. 58, No. 9, Sep. 2010, pp. 2326-2333.

Zhuo, Wei, et al., "Using capacitive cross-coupling technique in RF low noise amplifiers and down-conversion mixer design", Proceedings of the European Solid-State Circuits Conference 2000, Stockholm, Sweden, Sep. 19-21, 2000, pp. 77-80.

Xiong, Si, et al., "A dual-band 2.1GHz/5.2GHz LNA for reconfigurable radio", 10$^{th}$ IEEE International Conference on Solid-State and Integrated Circuit Technology (ICSICT) 2010, Nov. 1, 2010, pp. 710-712.

* cited by examiner

LOW NOISE TRANSCONDUCTANCE AMPLIFIERS

CROSS-REFERENCE TO RELATED APPLICATION

This application is also related to U.S. patent application Ser. No. 14/956,189 filed on even date herewith and titled "LOCAL OSCILLATOR PATHS," the disclosure of which is hereby incorporated by reference in its entirety herein.

BACKGROUND

Technical Field

Embodiments of this disclosure relate to electronic circuits, and more particularly, to transconductance amplifiers and/or to paths between an oscillator and a mixer.

Description of the Related Technology

A front end of a receiver can include a low noise amplifier, mixers to downconvert received signals, a local oscillator, and a signal path from the oscillator (OSC) to the mixer in which the signal path provides a local oscillator (LO) signal to the mixer. The front end of a radio frequency (RF) receiver typically amplifies and mixes RF signals received by way of an antenna. A low noise amplifier can amplify the received signals and provide the amplified signals to mixers. In demodulating RF signals, a mixer can downconvert RF signals to an intermediate frequency (IF), which is lower than the frequency of the received RF signal, by mixing the RF signals with a signal from an LO.

One form of a low noise amplifier is a low noise transconductance amplifier (LNTA). A LNTA amplifies RF signals received from an antenna and then provides an amplified RF current signal, which can be applied to a mixer.

Transconductance amplifiers provide an output current as a function of input voltage, and a common measure of transconductance in an amplifier and in a LNTA is its transconductance (Gm) transfer function. In addition to Gm transfer function, other characteristics of an LNTA also include noise performance and linearity. For quality reception and demodulation, an LNTA with a relatively low noise factor (NF) with low distortion is typically desirable.

In a receiver, the process of demodulation typically involves a mixer. Mixers can downconvert an input signal based on a signal from a LO. In some instances, separate mixers can be used to downconvert RF signals by different amounts so that the mixer outputs are at IF. For instance, one mixer can be used to downconvert RF signals in a high frequency band and another mixer can be used to downconvert RF signals in a low frequency band that is lower than the high frequency band. The LO signals provided to these mixers can have different frequencies and these LO signals can be generated by processing an output signal from a single OSC.

SUMMARY OF CERTAIN INVENTIVE ASPECTS

For purposes of summarizing the disclosure, certain aspects, advantages and novel features of the inventions have been described herein. It is to be understood that not necessarily all such advantages may be achieved in accordance with any particular embodiment of the invention. Thus, the inventions may be embodied or carried out in a manner that achieves or optimizes one advantage or group of advantages as taught herein without necessarily achieving other advantages as may be taught or suggested herein.

One aspect of this disclosure is an apparatus that includes a transconductance amplifier, mixers, and a capacitance circuit. The transconductance amplifier comprises split cascode current paths having a first current path from a cascode node to a first output and a second current path from the cascode node to a second output. The transconductance amplifier is configured to receive a radio frequency (RF) input voltage, provide an RF output current to the first output in a first state, and provide the RF output current to the second output in a second state. The mixers comprise a first mixer and a second mixer. The capacitance circuit comprises a first capacitor and a second capacitor. The first capacitor is electrically coupled between the first output of the transconductance amplifier and an input of the first mixer, and the second capacitor is electrically coupled between the second output of the transconductance amplifier and an input of the second mixer. The first capacitor and the second capacitor have different capacitances.

The transconductance amplifier can comprise a cross-coupled common gate amplifier. The cross-coupled common gate amplifier can comprise a first field effect transistor cross-coupled with a second field effect transistor, in which the cascode node is at a drain of the first field effect transistor.

The mixers can further comprise a third mixer and a fourth mixer, and the cascode node can be at a terminal of a first transistor of the cross coupled common gate amplifier. The transconductance amplifier can further comprise a second cascode node at a terminal of a second transistor of the cross coupled common gate amplifier in which the second transistor is cross-coupled with the first transistor. Also, the transconductance amplifier can be configured to provide a second RF output current from the second cascode node to an input of the third mixer in the first state; and the transconductance amplifier can provide the second RF output current from the second cascode node to an input of the fourth mixer in the second state.

The cascode node can have a low impedance relative to other nodes of the transconductance amplifier. Also, the first state can be associated with lower frequencies of the RF input voltage than the second state, and the capacitance of the first capacitor can be greater than the capacitance of the second capacitor. The first mixer can be configured to downconvert a frequency of the RF output current by a different amount in the frequency domain than the second mixer; and the first mixer and the second mixer can provide approximately the same signal gain.

The apparatus can further comprise a receiver having a high band to low band frequency ratio of at least 4, in which the receiver comprises the transconductance amplifier, the mixers, and the capacitance circuit. Also, the first state can be associated with the RF input voltage having a frequency in at least one of a 169 MHz frequency band or a 433 MHz frequency band; and the second state can be associated with the RF input voltage having a frequency in at least one of a 868 MHz frequency band or a 900 MHz frequency band. The transconductance amplifier can be configured to change state responsive to a control signal that is indicative of a frequency of the RF input voltage.

Another aspect of this disclosure is an apparatus comprising a transconductance amplifier, a capacitance circuit, and mixers. The transconductance amplifier comprises an amplification circuit and a select circuit. The amplification circuit is configured to receive a radio frequency input voltage and provide a radio frequency current. The select circuit is configured to receive the radio frequency current from the amplification circuit, provide the radio frequency current to a first output in a first state, and provide the radio frequency current to a second output in a second state. The capacitance circuit comprises a first capacitor electrically coupled to the first output of the select circuit and a second capacitor electrically coupled to the second output of the select circuit. The first capacitor and the second capacitor have different capacitances. The mixers comprise a first mixer and a second mixer. The first mixer has an input electrically connected to first output of the select circuit by way of the first capacitor; and the second mixer has an input electrically coupled to the second output of the select circuit by way of second capacitor.

The select circuit can be configured to change state responsive to a control signal; and the control signal can be indicative of a frequency of the radio frequency input voltage. Also, the first state can be associated with a lower frequency of the radio frequency input voltage than the second state; and the capacitance of the first capacitor can be greater than the capacitance of the second capacitor. The amplification circuit can comprise a cross coupled common gate amplifier; and the select circuit can be electrically connected to a cascode node having a low impedance relative to other nodes of the amplification circuit.

In another aspect of this disclosure, an electronic system comprises mixers, a low-noise transconductance amplifier, and an oscillator routing block. The mixers comprise a first mixer and a second mixer. The low-noise transconductance amplifier comprises split cascode current paths. The low-noise transconductance amplifier is configured to provide a radio frequency (RF) output current to the first mixer by way of a first coupling capacitor in a first state of the electronic system; and the low-noise transconductance amplifier is configured to provide the RF output current to the second mixer by way of a second coupling capacitor in a second state of the electronic system. The first capacitor and the second capacitor have different capacitances. The oscillator routing block comprises a first path between an oscillator and the first mixer and a second path between the oscillator and the second mixer. The oscillator routing block is configured to receive an oscillator signal from the oscillator, enable the first path in the first state of the electronic system, and enable the second path in the second state of the electronic system.

The first path of the oscillator routing block can be a low band path and the second path of the oscillator block can be a high band path, and the first state of the electronic system can be a low band state and the second state of the electronic system can be a high band state.

The first path of the oscillator routing block can comprise a radio frequency divider and a duty cycle correction circuit. The radio frequency divider can be configured to divide the oscillator signal by a positive odd integer divisor that is greater than one; and the duty cycle correction circuit can be configured to receive an output from the radio frequency divider and to provide an output having a duty cycle that is closer to 50% than the output from the radio frequency divider. The first path of the oscillator routing block can comprise a duty cycle reduction circuit electrically coupled between the duty cycle correction circuit and the first mixer. The duty cycle reduction circuit can be configured to receive the output of the duty cycle correction circuit and to provide an output having a duty cycle that corresponds to the duty cycle of the output of the duty cycle correction circuit divided by a positive even integer. The electronic system can comprise an I channel filter and a Q channel filter, in which the first mixer is electrically coupled to an input of the I channel filter and the second mixer is electrically coupled to an input of the Q channel filter.

Another aspect of this disclosure is an apparatus comprising an oscillator, mixers, and an oscillator routing block. The oscillator is configured to provide an oscillator signal. The mixers comprise a first mixer and a second mixer. The first mixer is configured to downconvert a low band radio frequency signal. The second mixer is configured to downconvert a high band radio frequency signal. The low band radio frequency signal is in a lower frequency band than the high band radio frequency signal. The oscillator routing block comprises a high band path between the oscillator and the first mixer and a low band path between the oscillator and the second mixer. The oscillator routing block is configured to receive the oscillator signal from the oscillator, to enable the high band path in a high band state to thereby enable the first mixer to downconvert the high band radio frequency signal, and to enable the low band path in a low band state to thereby enable the second mixer to downconvert the low band radio frequency signal.

The low band path can comprise a radio frequency divider configured to divide the oscillator signal in frequency by a positive odd integer divisor that is greater than one. In addition, the low band path can comprise a duty cycle correction circuit configured to receive an output from the radio frequency divider and to provide an output having a duty cycle that is closer to 50% than the output of the radio frequency divider. Also, the low band path can comprise a duty cycle reduction circuit electrically coupled between the duty cycle correction circuit and the first mixer. The duty cycle reduction circuit can be configured to receive the output of the duty cycle correction circuit and to provide an output having a duty cycle that corresponds to the duty cycle of the output of the duty cycle correction circuit divided by a positive even integer.

The apparatus can further comprise a third mixer electrically coupled to the low band path. The low band path can further comprise a quadrature generation circuit electrically coupled between the first mixer and the duty cycle correction circuit and also electrically coupled between the third mixer and the duty cycle correction circuit. The quadrature generation circuit can be configured to provide output signals to the first mixer and the third mixer so as to enable the first mixer to provide outputs for an I-channel and to enable the third mixer to provide outputs for a Q-channel.

The apparatus can further comprise a fourth mixer electrically coupled to the high band path. The high band path can comprise a second quadrature generation circuit electrically coupled to the second mixer and also electrically coupled to the fourth mixer. The second quadrature generation circuit can be configured to provide output signals to the second mixer and the fourth mixer so as to enable the second mixer to provide outputs for the I-channel and to enable the fourth mixer to provide outputs for the Q-channel. An input of the second quadrature generation circuit from the oscillator can have substantially the same frequency as the oscillator output.

The first mixer can be configured to provide a downconverted signal at a first output port. The second mixer can be configured to provide a downconverted signal at a second output port; and the first output port can be electrically connected to the second output port. The first mixer and the second mixer can be passive mixers.

In another aspect of this disclosure, an apparatus comprises mixers and an oscillator routing block. The mixers comprise a first mixer and a second mixer. The first mixer comprises an oscillator input and an output. The second mixer has an oscillator input and an output. The output of the first mixer and the output of the second mixer are electrically coupled to the same signal line. The oscillator routing block comprises a first path between an oscillator and the first mixer and a second path between the oscillator and the second mixer. The oscillator routing block is configured to receive a signal from the oscillator, to enable the first path in a first state to thereby enable the first mixer, and to enable the second path in a second state to thereby enable the second mixer.

The first path can further comprise a radio frequency divider and a duty cycle correction circuit. The radio frequency divider can be configured to divide the oscillator signal in frequency by an odd integer divisor that is greater than one; and the duty cycle correction circuit can be configured to receive an output from the radio frequency divider and to provide an output having a duty cycle that is closer to 50% than the output of the radio frequency divider.

The first path can be enabled in response to a control signal indicative of a frequency of a radio frequency input signal of the apparatus being in a low band and the second path can be enabled in response to a control signal being indicative of the radio frequency input signal being in a high band. The high band can correspond to higher frequencies than the low band. The first mixer and the second mixer can be passive mixers. The apparatus can further comprise a third mixer electrically coupled to the first path. The first path can further comprise a quadrature generation circuit electrically coupled between the first mixer and the duty cycle correction circuit and also electrically coupled between the third mixer and the duty cycle correction circuit. The quadrature generation circuit can be configured to provide output signals to the first mixer and the third mixer so as to enable the first mixer to provide outputs for an I-channel and to enable the third mixer to provide outputs for a Q-channel. Also, the quadrature generation circuit can be configured to provide four substantially non-overlapping LO signals to the mixers each having a 25% duty cycle.

In another aspect of this disclosure, an apparatus comprises an oscillator, a mixer, and an oscillator path. The oscillator is configured to provide an oscillator signal. The mixer is configured to downconvert a radio frequency signal. The oscillator path is between the oscillator and the mixer. The oscillator path comprises a radio frequency divider and a duty cycle correction circuit. The radio frequency divider is configured to receive the oscillator signal and to divide the oscillator signal in frequency by a positive odd integer divisor that is greater than one. The duty cycle correction circuit is configured to receive an output from the radio frequency divider and to provide an output having a duty cycle that is closer to 50% than the output from the radio frequency divider.

The oscillator path can further comprise a duty cycle reduction circuit electrically coupled between the duty cycle correction circuit and the mixer. The duty cycle reduction circuit can be configured to receive the output of the duty cycle correction circuit and to provide an output having a duty cycle that corresponds to the duty cycle of the output of the duty cycle correction circuit divided by a positive even integer. The oscillator path can also further comprise a 25% duty cycle circuit electrically coupled between the duty cycle correction circuit and the mixer. The 25% duty cycle circuit can be configured to provide an output to the mixer having a duty cycle of approximately 25%. The radio frequency divider can have an adjustable division ratio such that the radio frequency divider can divide by divisors that include the positive odd integer divisor and a positive even integer divisor. The duty cycle correction circuit can be configured to re-time its output based on the oscillator signal.

BRIEF DESCRIPTION OF THE DRAWINGS

These drawings and the associated description herein are provided to illustrate specific embodiments of the invention and are not intended to be limiting.

DETAILED DESCRIPTION OF EMBODIMENTS

Figure 1:
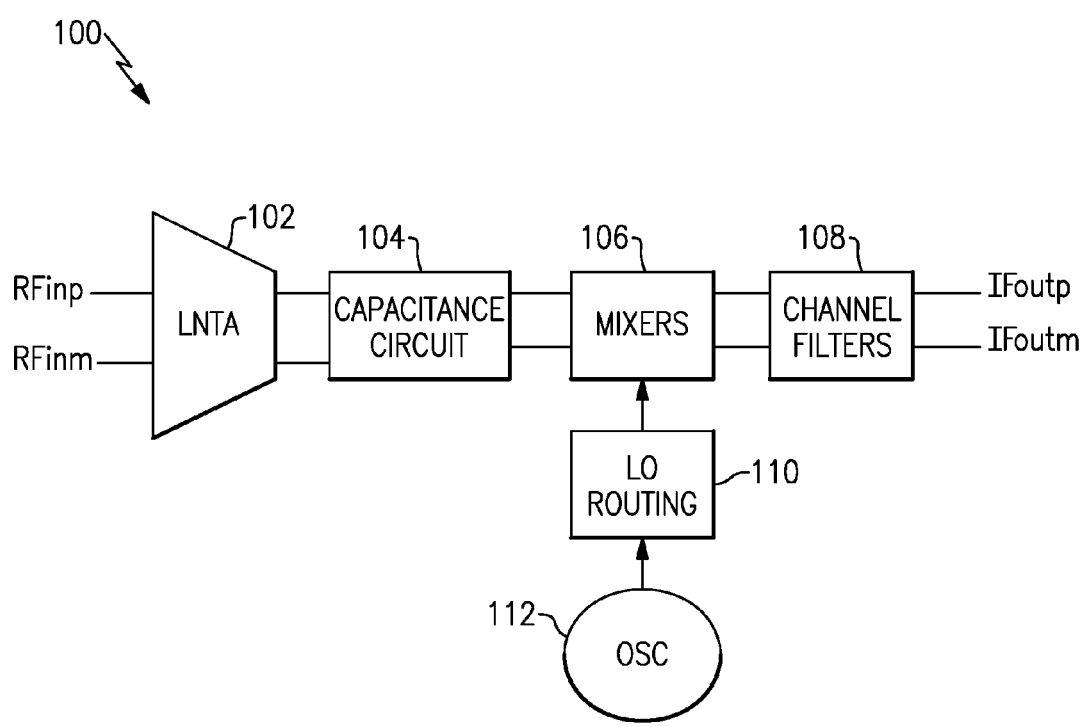
FIG. 1 is a schematic block diagram of a receiver architecture in accordance with the teachings herein.

The following detailed description of embodiments presents various descriptions of specific embodiments of the invention. However, the innovations described herein can be embodied in a multitude of different ways as defined and covered by the claims. In this description, reference is made to the drawings in which like reference numerals may indicate identical or functionally similar elements. It will be understood that elements illustrated in the figures are not necessarily drawn to scale. Moreover, it will be understood that systems, apparatus, and electronic devices including one or more of the innovations discussed herein can include more elements than illustrated in a drawing and/or a subset of the elements illustrated in a drawing. Further, some embodiments can incorporate any suitable combination of features from two or more drawings.

A radio frequency (RF) receiver can include a low noise transconductance amplifier (LNTA) to receive an RF signal voltage from an antenna and to convert the RF signal voltage into an RF signal current, which can in turn be applied to a mixer. An RF signal can have a frequency in the range from about 30 kHz to 300 GHz. In certain applications, the RF receivers discussed herein can receive and process RF signals in a range between about 150 MHz and about 1000 MHz. The mixer downconverts the RF signal current to an intermediate frequency (IF) signal as part of the demodulation process. The mixer can be a current-commutating passive mixer stage that can be switched by a quadrature local-oscillator (LO) signal, which can also be referred to as an IQ quadrature LO signal, to downconvert the input RF current to an IF signal having a lower frequency than the RF signal. The IF signal can be a current signal.

Linearity and noise figure (NF) can be a function of the receiver bandwidth such that receiver performance is related to the bandwidth. For instance, design components such as passive devices selected to enhance performance for one frequency range can cause degraded performance at another frequency range, for example, reducing the sensitivity performance. An example of a design component is a coupling capacitor. Coupling capacitors, which can also be referred to as alternating current (AC) coupling capacitors, can be electrically connected between an LNTA and a mixer. To support wideband modes of operation, an AC coupling capacitor between the LNTA and the mixer can have a capacitance selected so as to causes a high-pass corner frequency to include the lowest RF signal frequency band of the RF input signal. For example, if the desired band of operation is from 169 MHz to 960 MHz, then the AC coupling capacitor can have a capacitance sufficiently large to pass the lowest signals having frequency of 169 MHz without significant attenuation.

Coupling capacitors can also have parasitic capacitance that is proportional to the capacitor area. For instance, the parasitic capacitance of the AC coupling capacitor can be from about one to five percent of the total AC coupling capacitance due to a parasitic capacitor formed with the bottom plate of the AC coupling capacitor. Unfortunately, in certain applications, the parasitic capacitance can lead to degraded receiver performance as a function of RF signal input frequency. The noise figure (NF) of a receiver can be proportional to the square of the product of the parasitic capacitance $C_{PAR\_Ac}$ times the frequency of the input RF signal frequency fRF, for example, as indicated by Equation 1.

$$NF \geq (Cpar\_ac \cdot fRF)^2 \quad \text{Equation 1}$$

Moreover, parasitic capacitance associated with the AC coupling capacitor can result in a gain reduction as the RF signal frequency increases.

Considering empirical data in a design example for a 169 MHz to 960 MHz band of operation, the parasitic capacitor associated with the AC coupling capacitor disposed between the LNTA and the mixer can cause performance degradation as a function of frequency. In a particular design, NF measurements showed a degradation of NF as a function of frequency. The measured NF was 5.5 dB at 169 MHz but degraded to 7.9 dB at 900 MHz. In addition, the parasitic capacitance of the AC coupling capacitor caused the gain to be degraded for input RF signals operating in the 900 MHz band compared to RF signals operating in the 169 MHz band.

Accordingly, there is a need for an RF receiver front end which allows the use of AC coupling capacitors to meet the corner frequency specifications of the lowest frequency band of operation while mitigating effects of the associated parasitic capacitance as a function of frequency.

Apparatus and methods related to an RF receiver front end with an LNTA amplifier that can provide improved noise figure performance are presented herein. Such LNTAs can include a split cascode circuitry topology. An LNTA having split current paths can allow two or more AC coupling capacitors to be used for different operating frequencies instead of just one AC coupling capacitor in the current path between an LNTA and a mixer. By providing a first signal path with one AC coupling capacitor to meet the high-pass corner specifications of a lower frequency RF input signal and providing a second signal path with another AC coupling capacitor to meet the high-pass corner specification of a higher frequency RF input signal, the overall receiver performance can be improved compared to having only one AC coupling capacitor for both the lower frequency RF signal and the higher frequency RF signal. Using AC coupling capacitors having respective capacitances corresponding with particular RF bands of operation can significantly reduce undesirable effects of parasitic capacitance associated with operating at the lower RF frequency. This in turn can result in an improvement in the NF of the receiver at the higher frequency RF bands.

With split current paths, additional mixers can be implemented for downconverting associated with different frequencies. A mixer can be implemented for each current path. For instance, a mixer can be implemented in connection with each split current path in the LNTA and the associated AC coupling capacitor. For example, one mixer can be connected to an AC coupling capacitor associated with a lower range of frequencies of the receiver frequency band while another mixer is connected to an AC coupling capacitor associated with a higher range of frequencies of the receiver frequency band. A selection circuit in the LNTA can selectively provide an amplified RF signal from the LNTA to a selected path including an AC coupling capacitor and mixer.

A receiver can include a local oscillator (LO) to provide a LO output signal for mixing with the RF current signals from the LNTA. Before applying the LO output signal to a mixer for downconverting the RF current signals, the LO output signal can be modified into quadrature signals having I and Q quadrature components. In addition, the LO output signal can be processed. Such processing can include dividing the frequency of the LO output signal by an integer divisor which depends upon the frequency band of the RF current signal provided by the LNTA. Further, the duty-cycle of the LO output can be modified to enhance conversion gain through the mixers.

For a receiver having a 169 MHz to 900 MHz bandwidth, an RF divider can be implemented to divide by five when the RF current signal is in the 169 MHz band and to divide by two when the RF current signal is in a 433 MHz band. Dividing by 5 or other positive odd integer divisors can present technical challenges in a signal path from the LO to a mixer. When in an odd divide mode, the duty cycle of the signal output of the RF divider typically strays from 50%. However, a 50% duty cycle (or an approximately 50% duty cycle) can provide desirable receiver performance including desirable blocking performance. On the other hand, it can be easier to achieve duty cycles closer to 50% duty in even divide modes, such as a divide by 2 mode.

Accordingly, there is a need for local oscillator path(s) to accommodate mixing of RF current signals from an LNTA to allow dividing by both even and odd divisors.

An oscillator having split LO paths electrically coupled to its output is presented herein. Such an oscillator can be implemented in combination with any of the LNTAs discussed herein, such as a split cascode LNTA. The problem of generating 50% duty-cycle outputs when in divide by five mode or other odd divisor mode can be addressed by including a duty cycle correction (DCC) stage in a LO path between the oscillator and a mixer. Implementing separate LO signal paths for different frequency bands, in which at least one of the LO signal paths includes the DCC and a 25% duty-cycle generator can enhance receiver performance. Relatively low output phase noise can be achieved by re-timing an odd divide output with the LO output signal.

While embodiments discussed herein are presented in connection with receivers, it will be understood that any suitable principles and advantages discussed herein can alternatively or additionally be applied to transmitters. Although certain embodiments discussed herein are described with reference to two separate current paths in an LNTA, any suitable principles and advantages discussed herein can be applied to three or more separate current paths in an LNTA. Similarly, while certain embodiments discussed herein are described with reference to two separate LO paths, any suitable principles and advantages discussed herein can be applied to three or more separate LO paths.

FIG. 1 is a schematic block diagram of a receiver architecture 100 including a low noise transconductance amplifier (LNTA) 102 and a mixer block 106 in accordance with the teachings herein. The illustrated LNTA 102 receives RF input voltage signals RFinp and RFinm and converts the RF voltage input signals to RF current signals. The RF current signals are provided as input signals to a capacitance circuit 104, which include AC coupling capacitors arranged to couple the RF current signals to the mixer block 106. An oscillator (OSC) 112 provides an oscillator signal to a LO routing block 110, which can provide an LO quadrature signal to the mixer block 106. The illustrated mixer block 106 mixes the RF current signals from the capacitance circuit 104 with the LO quadrature signal to generate downconverted signals. The downconverted signals are then provided to channel filters 108. The channel filters 108 filter and provide intermediate frequency IF output signals IFoutp and IFoutm.

The LNTA 102 and the capacitance circuit 104 can together provide separate signal paths to different mixers in the mixer block 106, in which each of the separate signal paths are associated with a different frequency band of the RF input voltage signals RFinp and RFinm. These separate paths each include a different AC coupling capacitor in the capacitance circuit 104 that has a capacitance value selected for a particular frequency band. One path of the separate paths can allow RF current signals of a lower frequency band to pass to a first mixer of the mixer block 106 and another path of the separate paths can allow RF current signals of a higher frequency band to pass to a second mixer of the mixer block 106. A control signal indicative of whether the RF input voltage signals RFinp and RFinm are within the lower frequency band or the higher frequency band a selectively active one of these paths.

Having more than one path allows the use of coupling capacitors of the capacitor circuit 104 with different values. One coupling capacitor can have a relatively large capacitance that is sufficient to pass RF current signals of the lower frequency band to pass to the mixers block 106 and another coupling capacitor can have a smaller capacitance suitable for passing RF current signals of the higher frequency band. Accordingly, the higher frequency signals can pass through a path having a lower parasitic capacitance to provide improved noise figure and gain relative to having the higher frequency signals pass through a signal path with a capacitance sufficiently large to also pass RF signals of the lower frequency band.

Additionally, the LO routing block 110 can selectively enable one of a plurality of paths for dividing and processing the oscillator signal from the oscillator 112. By providing at least two paths to the mixer block 106, the LO quadrature signal provided to the mixer block 106 can be divided by a divisor appropriate to the frequency band of the RF current input signal and also be suitably processed. The oscillator 112 can be an internal or external oscillator. The oscillator 112 can be a voltage controlled oscillator (VCO) as indicted by its output signal being labeled VCO. However, in other embodiments, the oscillator 112 can be a current controlled oscillator (ICO).

Figure 2A:
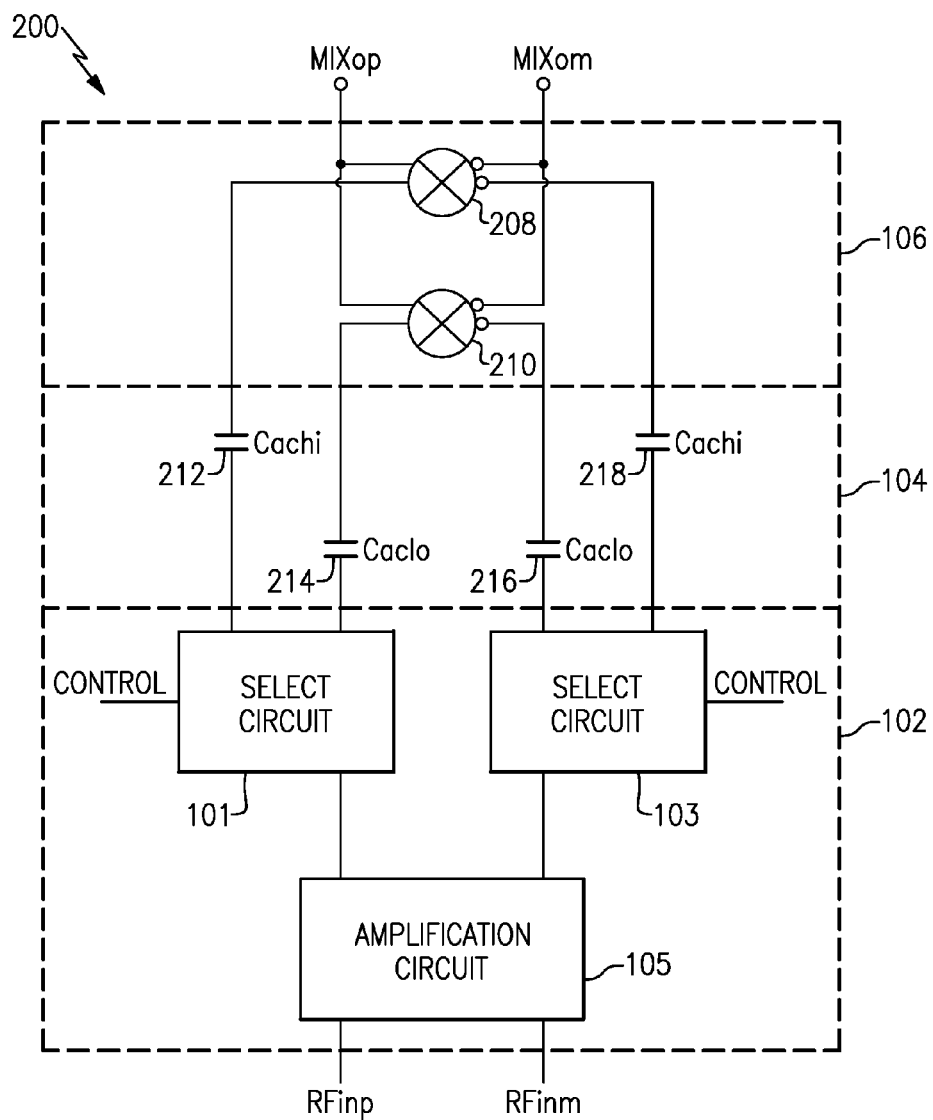
FIG. 2A is a diagram of a portion of a receiver architecture in accordance with the teachings herein.

FIG. 2A is a diagram of a portion of a receiver architecture 200 in accordance with the teachings herein. As illustrated, the receiver architecture 200 includes an LNTA 102, a capacitance circuit 104, and a mixer block 106. The LNTA 102 has an amplification circuit 105, a first select circuit 101, and a second select circuit 103. The amplification circuit 105 receives RF input voltage signals RFinp and RFinm and provides a first RF current signal to the first select circuit 101 and a second RF current signal to the second select circuit 103. The amplification circuit 105 can be implemented by any suitable transconductance stage. The first select circuit 101 has two output paths: one output path through a capacitor 212 to a mixer 208, and another path through a capacitor 214 to a mixer 210. The first select circuit 101 can provide an amplified RF signal from the amplification circuit 105 to a selected one of the output paths responsive to a control signal. The control signal can be indicative of the frequency of the RF input signals RFinp and RFinm. The second select circuit 103 similarly has two output paths: one path through a capacitor 218 to the mixer 208, and another path through a capacitor 216 to the mixer 210. The second select circuit 103 can provide also provide an amplified RF signal from the amplification circuit 105 to a selected one of the output paths responsive to the control signal. The select circuits can select between three or more output paths having different coupling capacitors in other embodiments (not illustrated).

When the RF input signals RFinp and RFinm have a frequency associated with a lower frequency band, then the first select circuit 101 and the second select circuit 103 can route the RF current signals through the capacitor 214 and the capacitor 216, respectively. In other words, the capacitor 214 and the capacitor 216 are selected to operate as AC coupling capacitors in a low band mode. When the RF input signals RFinp and RFinm have a frequency associated with a higher frequency band, then the first select circuit 101 and the second select circuit 103 can route the RF current signals through the capacitor 212 and the capacitor 218, respectively. In other words, the capacitor 212 and the capacitor 218 are selected to operate as AC coupling capacitors in a high band mode.

Also as shown in FIG. 2A the mixer 208 has a first and second output and the mixer 210 has a first and second output. The first outputs of mixers 208 and 210 are connected together and provide a mixer output signal MIXop, and the second outputs of mixers 208 and 210 are connected together and provide a mixer output signal MIXom. The mixer outputs MIXop and MIXom can be current or voltage signals having a difference frequency component, a sum frequency component, and a component with a frequency equal to a local oscillator frequency component. The mixer output signals MIXop and MIXom can be differential signals.

As illustrated, the capacitors 214 and 216 have a capacitance Caclo and the capacitors 212 and 218 have a capacitance Cachi. The capacitance Caclo can be designed to allow RF current signals of a lower frequency band to pass to the mixer 210 while the capacitance Cachi can be designed to allow RF current signals of a higher frequency band to pass to the mixer 208. Accordingly, Cachi can have a lower value of capacitance than Caclo, and this in turn can cause a parasitic capacitance of the capacitors 212 and 218 to be lower than a parasitic capacitance of the capacitors 214 and 216. In certain applications, Cachi can have a capacitance in a range from about 0.5 pF to 0.9 pF and Caclo can have a capacitance in a range from about 1.0 pF to 2.0 pF. The ratio of the capacitances Cachi:Caclo can be about 2:1 to about 4:1 in certain implementations. Following a path of lower parasitic capacitance, the RF current signals of the higher frequency band can advantageously pass to the mixer 208 with improved noise figure and gain relative to a path having a higher parasitic capacitance.

While the different output paths associated with the select circuits 101 and 103 have been discussed with reference to different frequency bands, such different paths can have different coupling capacitances for any other suitable reason.

Figure 2B:
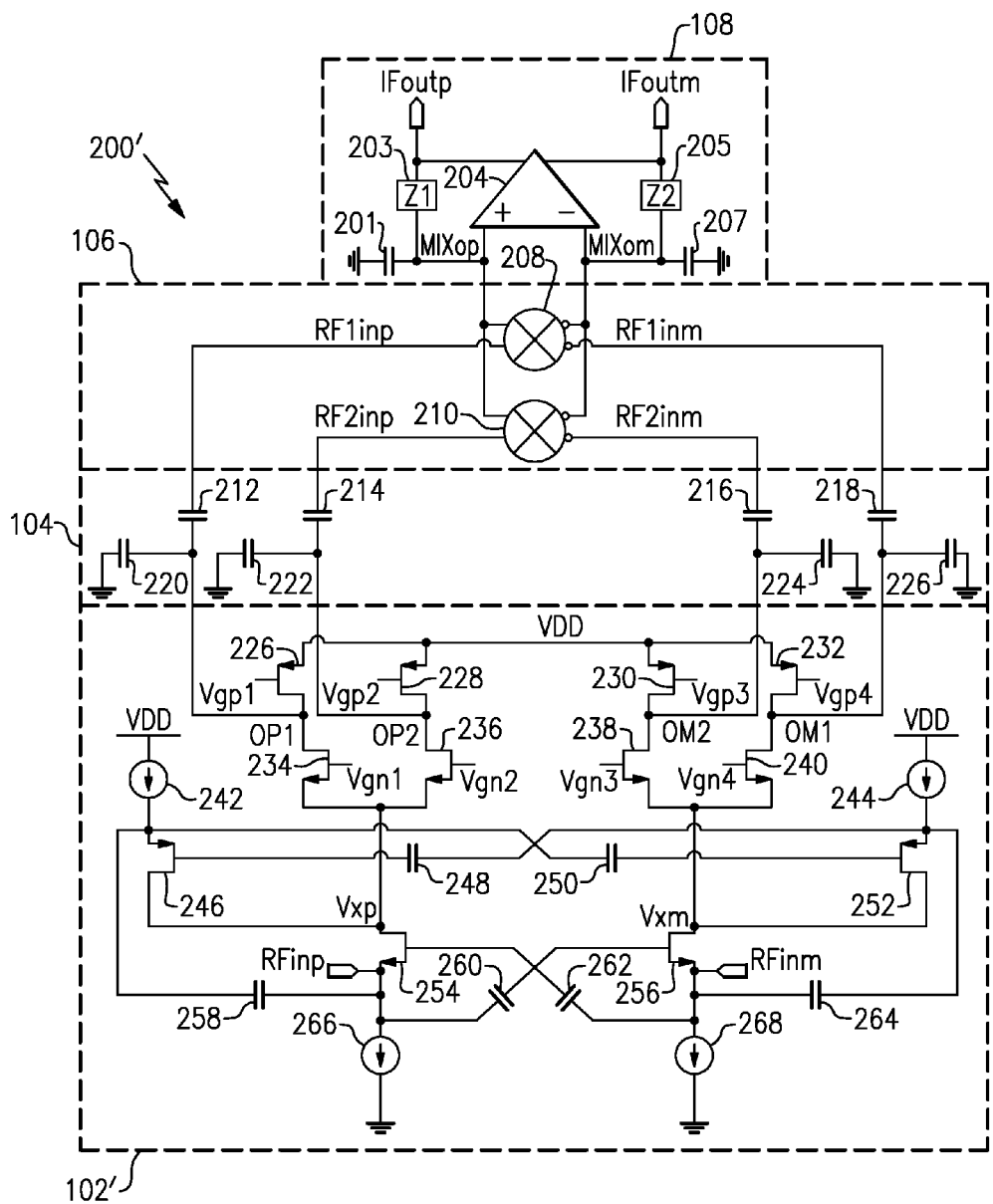
FIG. 2B is a schematic diagram of a split cascode low noise transconductance amplifier in accordance with the teachings herein.

FIG. 2B is a schematic diagram of a portion of a receiver architecture 200' in accordance with the teachings herein. The receiver architecture 200' includes a split cascode low noise transconductance amplifier 102', the capacitance circuit 104, the mixer block 106, and the channel filter 108.

The LNTA 102' is an illustrative embodiment of the LNTA 102 of FIG. 2A. As illustrated, the split cascode LNTA 102' includes an n-type field effect transistor (NFET) 254, an NFET 256, an NFET 234, an NFET 236, an NFET 238, an NFET 240, a p-type field effect transistor (PFET) 246, a PFET 252, a PFET 226, a PFET 228, a PFET 230, and a PFET 232. The illustrated split cascode LNTA 102' also includes a capacitor 258, a capacitor 260, a capacitor 262, a capacitor 264, a capacitor 248, and a capacitor 250. In addition, the illustrated split cascode LNTA 102' includes a current source 242, a current source 244, a current source 266, a current source 268.

Outputs of the illustrated LNTA 102' are provided to the capacitance circuit 104. The capacitance circuit 104 illustrated in FIG. 2B is the same as the capacitance circuit 104 illustrated in FIG. 2A. In FIG. 2B, parasitic capacitors 220, 222, 224, and 226 associated with the capacitors 212, 214, 216, and 218, respectively, are also illustrated. These parasitic capacitors are also present in the capacitance circuit 104 of FIG. 2A.

Mixers 208 and 210 of the mixer block 106 of FIG. 2B are also substantially the same or functionally similar to the same mixers in FIG. 2A. In FIG. 2B illustrates outputs of the mixers 208 and 210 being coupled to the channel filters 108. FIG. 2B shows that outputs of the mixers 208 and 210 can be coupled to the same signal lines between the mixer block 106 and the channel filters 108. As illustrated, the channel filters 108 include an amplifier 204, an impedance 203, an impedance 205, a capacitor 201, and a capacitor 207. The impedance 203 can have an impedance of Z1 and the impedance 205 can have an impedance of Z2. Z1 can equal Z2. In certain embodiments, the impedances 203 and 205 can each be implemented by resistors.

In the split cascode LNTA 102' shown in FIG. 2B, the current source 242, the current source 244, the current source 266, the current source 268, the PFET 246, the PFET 252, the NFET 254, the NFET 256, the capacitor 258, the capacitor 260, the capacitor 262, the capacitor 264, the capacitor 248, and the capacitor 250 implement an embodiment of the amplification circuit 105 of FIG. 2A. The transistors 254 and 256 can serve as amplifier transistors that amplify the RF input signals RFinp and RFinm in the amplification circuit of the LNTA 102'. The NFET 254 and the NFET 256 form a common gate differential cross coupled connected pair. Accordingly, these transistors can be referred as differential a common gate differential cross coupled amplifier transistors. The capacitor 262 is connected between a gate of the NFET 254 and a source of the NFET 256, and the capacitor 260 is connected between a gate of the NFET 256 and a source of the NFET 254.

Similarly, the PFET 246 and the PFET 252 form a common gate differential cross coupled connected pair. These transistors can also serve to amplify the RF input signals RFinp and RFinm in the amplification circuit of the LNTA 102'. These transistors can be referred as differential common gate differential cross coupled amplifier transistors. The capacitor 248 is connected between a gate of the PFET 246 and a source of the PFET 252, and the capacitor 250 is connected between a gate of the PFET 252 and a source of the PFET 246. The capacitor 258 is connected between the source of the PFET 246 and the source of the NFET 254, and the capacitor 264 is connected between the source of the PFET 252 and the source of the NFET 256. Also, a drain of the PFET 246 is connected to a drain of the NFET 254, while a drain of the PFET 252 is connected to a drain of the NFET 256.

In the split cascode LNTA 102' of FIG. 2B, the capacitors 248, 250, 260, and 262 function as cross coupling capacitors between differential pairs of amplifier transistors. The capacitors 248, 250, 260, and 262 can be designed to have approximately the same capacitance as each other. This can improve noise performance relative to if these capacitors were significantly mismatched relative to each other. Similarly, the capacitors 258 and 264 can be have approximately the same capacitances as each other for improved performance.

The current source 242 is connected between a supply node VDD and the source of the PFET 246, and the current source 244 is connected between the supply node VDD and the source of the PFET 252. Also, the current source 266 is connected between a ground node and the source of the NFET 254, and the current source 268 is connected between the ground node and the source of the NFET 256. The current sources 242, 244, 266, and 268 can operate so as to provide direct current (DC) bias current to the PFET 242, the PFET 244, the NFET 254, and the NFET 256, respectively. Additionally, the values of the DC current in the current sources 242 and 244 can be approximately equal, and the values of DC current sources 266 and 268 can be approximately equal and also larger than current sources 242 and 244.

The NFET 254 and the NFET 256 form a differential pair which receives an RF input voltage signal RFinp at the source of the NFET 254 and an RF input voltage signal RFinm at the source of the NFET 256. The PFET 246 and the PFET 252 also form a differential pair which receives an RF input voltage signal RFinp AC coupled via capacitor 258 to the source of the PFET 246 and an RF input voltage signal RFinm AC coupled via capacitor 264 to the source of the PFET 252. The split cascode LNTA 102' converts the RF input voltage signal RFinp to an RF current signal flowing through the drain of the NFET 254 and also converts the RF input voltage signal RFinm to an RF current signal flowing through the drain of the NFET 256. In this way, a differential RF input voltage signal defined by the difference of the RF input voltage signals RFinp and RFinm is converted to a differential RF current signal by virtue of amplifier transconductance. The differential RF current signal can be determined by a difference of the RF current signals flowing through the drains of the NFETs 254 and 256.

In the split cascode LNTA 102' shown in FIG. 2B, the PFET 226, the PFET 228, the NFET 234, and the NFET 236 implement an embodiment of the first selection circuit 101 of FIG. 2A. The PFET 226 has a source connected to the supply node VDD and a gate receiving a bias voltage Vgp1. The PFET 228 has a source connected to the supply node VDD and a gate receiving a bias voltage Vgp2. The NFET 234 has a gate receiving a bias voltage Vgn1, and the NFET 236 has a gate receiving a bias voltage Vgn2. A drain of the NFET 234 is connected to a drain of the PFET 226 at a first output node labelled OP1; and a drain of NFET 236 is connected to a drain of the PFET 228 at a second output node labelled OP2. Also, a source of the NFET 234 is connected to a source of the NFET 236.

As shown in FIG. 2B, the sources of the NFET 234 and the NFET 236 connect to the drain of the NFET 254 to form a node Vxp. The node Vxp can be recognized as a cascode node which operates with lower impedance compared to other nodes within the split cascode LNTA 102'. As described above, in response to the applied RF input voltage signal RFinp, an RF current signal can flow in the NFET 254. The bias voltages Vgp1, Vgn1, Vgp2, and Vgn2 can be based on a control signal indicative of a frequency band of the RF input voltage signal RFinp to allow the RF current signal in the NFET 254 to either flow through the NFET 234 or through the NFET 236.

Also as shown in FIG. 2B, the capacitor 212 is connected between an input port RF1inp of the mixer 208 and the drain of the NFET 234; and the capacitor 214 is connected between an input port RF2inp of the mixer 210 and the drain of the NFET 236. The parasitic capacitor 220 associated with the capacitor 212 has a lower parasitic capacitance than the parasitic capacitor 222 associated with the capacitor 214. When the bias voltages Vgp1, Vgn1, Vgp2, and Vgn2 are such that the RF current signal flows through the NFET 234, the capacitor 212 couples the RF current signal to the mixer 208 at input port RF1inp. Alternatively, when the bias voltages Vgp1, Vgn1, Vgp2, and Vgn2 are such that the RF current signal flows through the NFET 236, then capacitor 214 couples the RF current signal to the mixer 210 at input port RF2inp.

In the split cascode LNTA 102' shown in FIG. 2B, the PFET 230, the PFET 232, the NFET 238, and the NFET 240 implement an embodiment of the second selection circuit 103 of FIG. 2A. The PFET 230 has a source connected to the supply node VDD and a gate receiving a bias voltage Vgp3. The PFET 232 has a source connected to the supply node VDD and a gate receiving a bias voltage Vgp4. The NFET 238 has a gate receiving a bias voltage Vgn3, while the NFET 240 has a gate receiving a bias voltage Vgn4. A drain of the NFET 238 is connected to a drain of the PFET 230 at a second output node labelled OM2; and a drain of NFET 240 is connected to a drain of the PFET 232 at a first output node labelled OM1. Also, a source of the NFET 238 is connected to a source of the NFET 240.

As shown in FIG. 2B, the sources of the NFET 238 and the NFET 240 also connect to the drain of the NFET 256 to form a node Vxm. The node Vxm, like the node Vxp, can also be recognized as a cascode node which operates with lower impedance compared to other nodes within the split cascode LNTA 102'. As described above, in response to the applied RF input voltage signals RFinm, an RF current signal can flow in the NFET 256. The bias voltages Vgp3, Vgn3, Vgp4, and Vgn4 can be based on a control signal indicative of a frequency band of the RF input voltage signal RFinm to allow the RF current signal in the NFET 256 to either flow through the NFET 238 or through the NFET 240.

Also as shown in FIG. 2B, the capacitor 218 is connected between an input port RF1inm of the mixer 208 and the drain of the NFET 240; and the capacitor 216 is connected between an input port RF2inm of the mixer 210 and the drain of the NFET 238. The parasitic capacitor 226 associated with the capacitor 218 has a lower parasitic capacitance than the parasitic capacitor 224 associated with the capacitor 216. When the bias voltages Vgp3, Vgn3, Vgp4, and Vgn4 are such that the RF current signal from the drain of the NFET 256 flows through the NFET 240, the capacitor 218 couples the RF current signal to the mixer 208 at input port RF1inm. When the bias voltages Vgp3, Vgn3, Vgp4, and Vgn4 are such that the RF current signal from the drain of the NFET 256 flows through the NFET 238, the capacitor 216 couples the RF current signal to the mixer 210 at input port RF2inm.

The states of selection circuits can define two modes of operation in which RF output signals are provided to different AC coupling capacitors and associated mixers. These modes of operation can include a high band mode for frequencies greater than a threshold frequency value and a low band mode for frequencies less than the threshold frequency value. For instance, in the high band mode when the frequency of the RF input voltage signals RFinp and RFinm exceeds the threshold frequency, the bias voltages Vgp1 to Vgp4 and Vgn1 to Vgn4 can be applied so that the RF current signals in the NFET 254 and the NFET 256 couple through the capacitors 212 and 218 to the mixer 208 via input ports labelled RF1inp and RF1inm, respectively. As discussed in connection with FIG. 2A, the high band mode allows the RF current signals to couple through the paths having the lower parasitic capacitance represented by the parasitic capacitors 220 and 226.

Alternatively, in the low band mode when the frequency of the RF input voltage signals RFinp and RFinm is less than the threshold frequency, the bias voltages Vgp1 to Vgp4 and Vgn1 to Vgn4 can be applied so that the RF current signals in the NFET 254 and the NFET 256 couple through the capacitors 214 and 216 to the mixer 210 via input ports labelled RF2inp and RF2inm, respectively. As discussed in connection with FIG. 2A, this mode allows lower frequency RF current signals to couple through the paths having higher parasitic capacitance represented by the parasitic capacitors 222 and 224. Also, as discussed in connection with FIG. 2A, the low band mode selects the path of higher coupling capacitance in order to meet the minimum frequency bandpass specification for lower frequency RF input signals. Having a low band mode and a high band mode selection process advantageously allows the higher frequency signals to couple through the lower capacitance of the capacitors 214 and 218.

As an example, for a receiver operating at frequencies from about 150 MHz to about 960 MHz bandwidth, using the split cascode LNTA 102' of FIG. 2B can result in a noticeable improvement (reduction) in Noise Figure (NF) and gain over the entire bandwidth relative to a corresponding previous receiver without selection circuits, separate AC coupling capacitors, and separate mixer for different frequency bands. A NF of 6.0 dB was measured at 915 MHz, representing a 1.9 dB improvement (reduction) over the corresponding previous receiver. In addition, the 169 MHz NF was not degraded for the case using the split cascode LNTA 102' of FIG. 2B. These measurements indicate an advantage of the split cascode LNTA 102' using the split low band and high band paths as compared to an LNTA that includes a single path.

In FIG. 2B, the mixer 208 operates during the high band mode to mix RF current signals coupled to the input ports RF1inp and RF1inm with local oscillator signals from a first path (not shown in FIG. 2B) so as to downconvert the RF current signals to an intermediate frequency for further demodulation. The mixer 210 similarly operates during the low band mode to mix RF current signals coupled to the input ports RF2inp and RF2inm with local oscillator signals from a second path (not shown in FIG. 2B) so as to downconvert the RF current signals to the intermediate frequency for further demodulation.

The down-converted IF output current signals are converted to a voltage by an amplifier 204. A noninverting input of the amplifier 204 is connected to a first output of the mixer 210 and a first output of the mixer 208, and an inverting input of the amplifier 204 is connected to a second output of the mixer 210 and a second output of the mixer 208. As described above, the mixer 208 operates during the high band mode while the mixer 210 operates during the low band mode. Because only one of the mixers 208 and 210 can operate at a time depending upon the frequency band of the RF input signals, the outputs of the mixers 208 and 210 can be connected together as shown in FIG. 2B. Also, as shown in FIG. 2B, the impedance 203 provides low pass filtering between an inverting output and the noninverting input of the amplifier 204 and the impedance 205 provides low pass filtering between a noninverting output and the inverting input of the amplifier 204. Accordingly, the amplifier 204 with the impedances 203 and 205 provide buffered IF output signals IFoutp and IFoutm at the inverting and noninverting output nodes of the amplifier 204, respectively. The IF output signals IFoutp and IFoutm can be filtered as to remove frequencies outside of a particular IF frequency band. Additionally, low-pass filtering can be implemented at this stage using the capacitors 201 and 207. The capacitors 201 and 207 can remove components of frequency relating to the local oscillator frequency. In certain applications, the capacitors 201 and 207 can have capacitances in a range from about 10 pF and 20 pF.

Figure 2C:
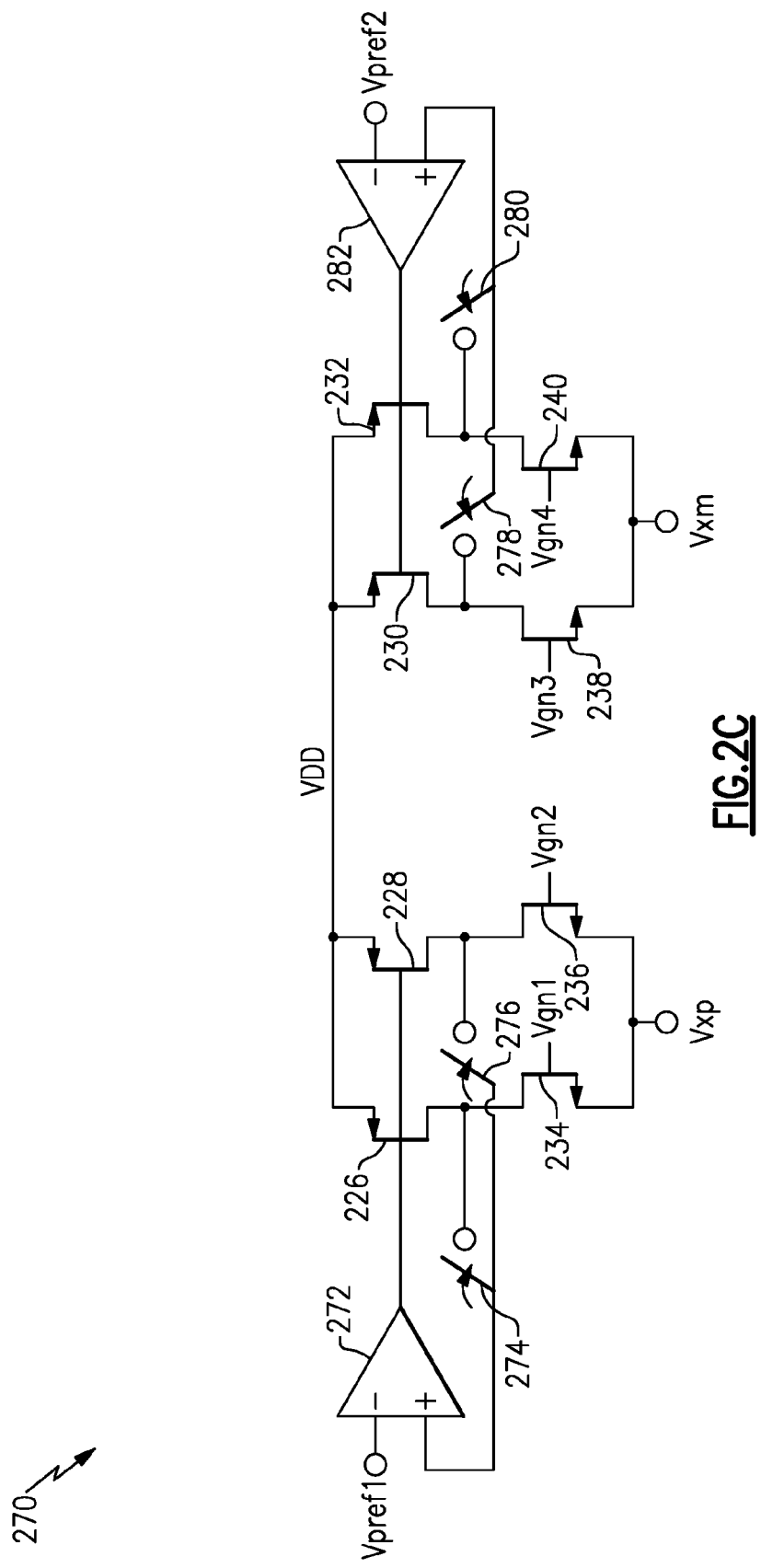
FIG. 2C is a schematic diagram of an illustrative gate bias generator circuit for the low noise transconductance amplifier of FIG. 2B.

FIG. 2C is a schematic diagram of a gate bias generator circuit 270 for the split cascode LNTA 102' of FIG. 2B. As discussed above with respect to FIG. 2B, the PFET 226, the PFET 228, the NFET 234, and the NFET 236 form an embodiment of the first select circuit 101 of FIG. 2A; and the PFET 230, the PFET 232, the NFET 238, and the NFET 240 form an embodiment of the second select circuit 103 of FIG. 2A. Also as described above, the gate voltages Vgp1 to Vgp4 and Vgn1 to Vgn4 can be based on a control signal indicative of the high band mode or the low band mode. In FIG. 2C, the gate bias generator circuit 270 provides an illustrative circuit that provides such bias voltage for a selection circuit of the LNTA 102'.

In FIG. 2C, the gate of a PFET 226 and the gate of a PFET 228 are both connected to an output of an amplifier 272 so that the amplifier 272 provides the bias voltages Vgp1 and Vgp2. In this scheme, the labels Vgp1 and Vgp2 are not shown because the gates are both connected together and therefore represent approximately the same potential. Similarly, the gate of a PFET 230 and the gate of a PFET 232 are both connected to an output of an amplifier 282 so that the amplifier 282 provides the bias voltages Vgp3 and Vgp4. The labels Vgp3 and Vgp4 are also not shown since they represent the approximately same potential. Also as shown, an inverting input of the amplifier 272 receives a reference voltage Vpref1 and an inverting input of the amplifier 282 receives a reference voltage Vpref2. A noninverting input of the amplifier 272 is connected to a first terminal of a switch 274 and to a first terminal of a switch 276; and a noninverting input of the amplifier 282 is connected to a first terminal of a switch 280 and to a first terminal of a switch 278. A second terminal of the switch 274 is connected to the drain of the PFET 226, and a second terminal of the switch 276 is connected to the drain of the PFET 228. Similarly, a second terminal of the switch 280 is connected to the drain of the PFET 232, and a second terminal of the switch 278 is connected to the drain of the PFET 230.

As described above with respect to FIG. 2B, the current path is split at the nodes Vxp and Vxm depending on a mode of operation relating to the frequency band of the RF voltage input signals RFinp and RFinm. In the high band mode, the current path is selected such that the PFET 226 and the NFET 234 are biased to allow the RF current input signal at the node Vxp to couple through the capacitor 212 of FIG. 2B. At the same time, the PFET 232 and the NFET 240 can be biased to allow the RF current input signal at the node Vxm to couple through the capacitor 218 of FIG. 2B. The NFET 234 and the NFET 236 can further operate as a multiplexer for the RF current input signal at the node Vxp, while the NFET 238 and the NFET 240 operate as a multiplexer for the RF current input signal at the node Vxm.

In the high band mode, the switch 274 and the switch 280 can be closed, and the switch 276 and the switch 278 can be open. This allows the amplifier 272 to servo bias the PFET 226 and the amplifier 282 to servo bias the PFET 232. Further, while in the high band mode the gate bias Vgn1 and Vgn4 can be have a higher voltage while the gate bias Vgn2 and Vgn3 can have a lower voltage value. In the low band mode the switch 274 and the switch 280 can be open, and the switch 276 and the switch 278 can be closed. This allows the amplifier 272 to servo bias the PFET 228 and the amplifier 282 to servo bias the PFET 230. Also while in the low band mode, the gate bias Vgn1 and Vgn4 can have a lower voltage value while the gate bias Vgn2 and Vgn3 can have a higher voltage value.

Although the embodiment of FIG. 2C shows the amplifiers 272 and 282 as being connected with ideal switches, one can appreciate that ideal switches can be realized with NFET and/or PFET devices. In some other embodiments, the reference voltages Vrfp1 and Vrfp2 can be provided using resistor dividers or other circuit approaches such as bandgap references. Further, the reference voltages Vrfp1 and Vrfp2 can be made equal by design.

Further, a high band mode and a low band mode can be dependent upon a particular application. For instance, considering the example of a 169 MHz to 960 MHz band application, a high band mode can be defined for RF inputs in the 868 MHz and 900 MHz bands, and a low band mode can be defined for RF inputs in the 169 MHz and 433 MHz bands. According to certain embodiments, any of the receivers discussed herein can have a high band to low band frequency ratio of at least 4. In some of these embodiments, the receiver can have a high band to low band frequency ratio of at least 5, such as about 5.7 when the high band corresponds to 960 MHz and the low band corresponds to 169 MHz. Referring to FIGS. 2B and 2C, in the high band mode, the NFET 234 and the PFET 226 are enabled as a cascode to couple RF current signals at the node Vxp through the capacitor 212 and to the mixer 208 at the input port RF1inp. At the same time, the NFET 236 is off. Also, in the high band mode the NFET 240 and the PFET 232 are enabled as a cascode to couple RF current signals at the node Vxm through the capacitor 218 to the mixer 208 at the input port RF1inm. At the same time, the NFET 238 is off. In this way, the RF signals in the 868 MHz and 900 MHz bands are isolated from the larger parasitic capacitance represented by the parasitic capacitors 222 and 224. Instead, they couple through paths having the lower parasitic capacitance represented by the parasitic capacitors 220 and 226.

In the low band mode, the NFET 236 with the PFET 228 are enabled as a cascode to couple RF current signals at the node Vxp through the capacitor 214 to the mixer 210 at the input port RF2inp. At the same time the NFET 234 is off. Also, in the low band mode the NFET 238 and the PFET 230 are enabled as a cascode to couple RF input signals at the node Vxm through the capacitor 216 to the mixer 210 at the input port RF2inm. At the same time, the NFET 240 is off. In this way, the RF signals in the 169 MHz and 433 MHz bands are coupled to respective mixers by the AC coupling capacitors 214 and 216 designed to provide enough capacitance to pass RF signals in the lowest frequency band, namely the 169 MHz band. Also as described above, in the high band mode the mixer 208 is enabled while the mixer 210 is not enabled, and in the low band mode the mixer 208 is not enabled while the mixer 210 is enabled.

Although the NFET 254, 256, 234, 236, 238, and 240, with the PFET 246, 252, 226, 228, 230, and 232 are shown as individual transistors in FIGS. 2B and 2C, any of these transistors can be implemented in an integrated circuit using layout techniques for matching and reducing parasitic capacitances. For instance, one method of implementing the NFET and PFET transistors is to use binary weighted arrays of unit size NFET and PFET devices to allow gain control to be implemented. By splitting the RF path current at nodes Vxp and Vxm, gain control achieved by scaling of NFETs 254 and 256 and PFETs 246 and 252 can be implemented for both the high-band and low-band signal paths.

Figure 2D:
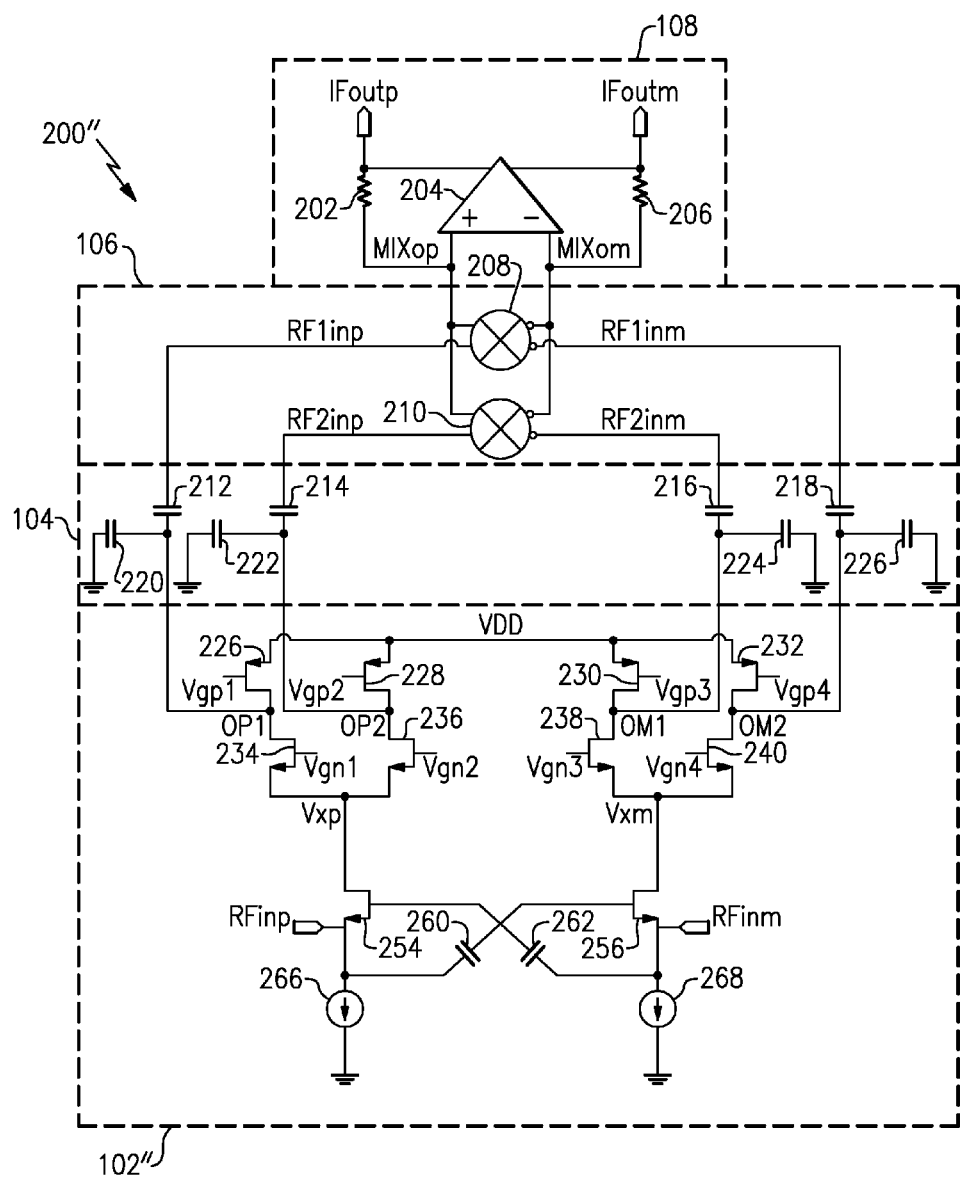
FIG. 2D is a schematic diagram of a split cascode low noise transconductance amplifier according to another embodiment.

FIG. 2D is a schematic diagram of a portion of the receiver architecture 200" that includes a split cascode low noise transconductance amplifier (LNTA) 102" according to another embodiment. The split cascode LNTA 102" of FIG. 2D is similar to the split cascode LNTA 102' of FIG. 2B except the amplification circuit omits the cross coupled common gate configuration including PFETs, corresponding coupling capacitors, and corresponding current sources. In addition, the channel filters 108 uses the amplifier 204 configured as a transimpedance amplifier with shunt resistors 202 and 206. In FIG. 2D the shunt resistor 202 and a shunt resistor 206 are an illustrative example of the impedances 203 and 205, respectively, of FIG. 2B. The shunt resistor 202 can amplify the current signal MIXop so as to provide IFoutp, and the shunt resistor 206 can amplify the current signal MIXom so as to provide IFoutm. Additionally, low-pass filtering can be implemented at this stage using the capacitors such as capacitors 201 and 207 of FIG. 2B (not shown in FIG. 2D).

The operation of the split cascode LNTA 102" is similar to that of the split cascode LNTA 102' of FIG. 2B as described above.

Figure 3:
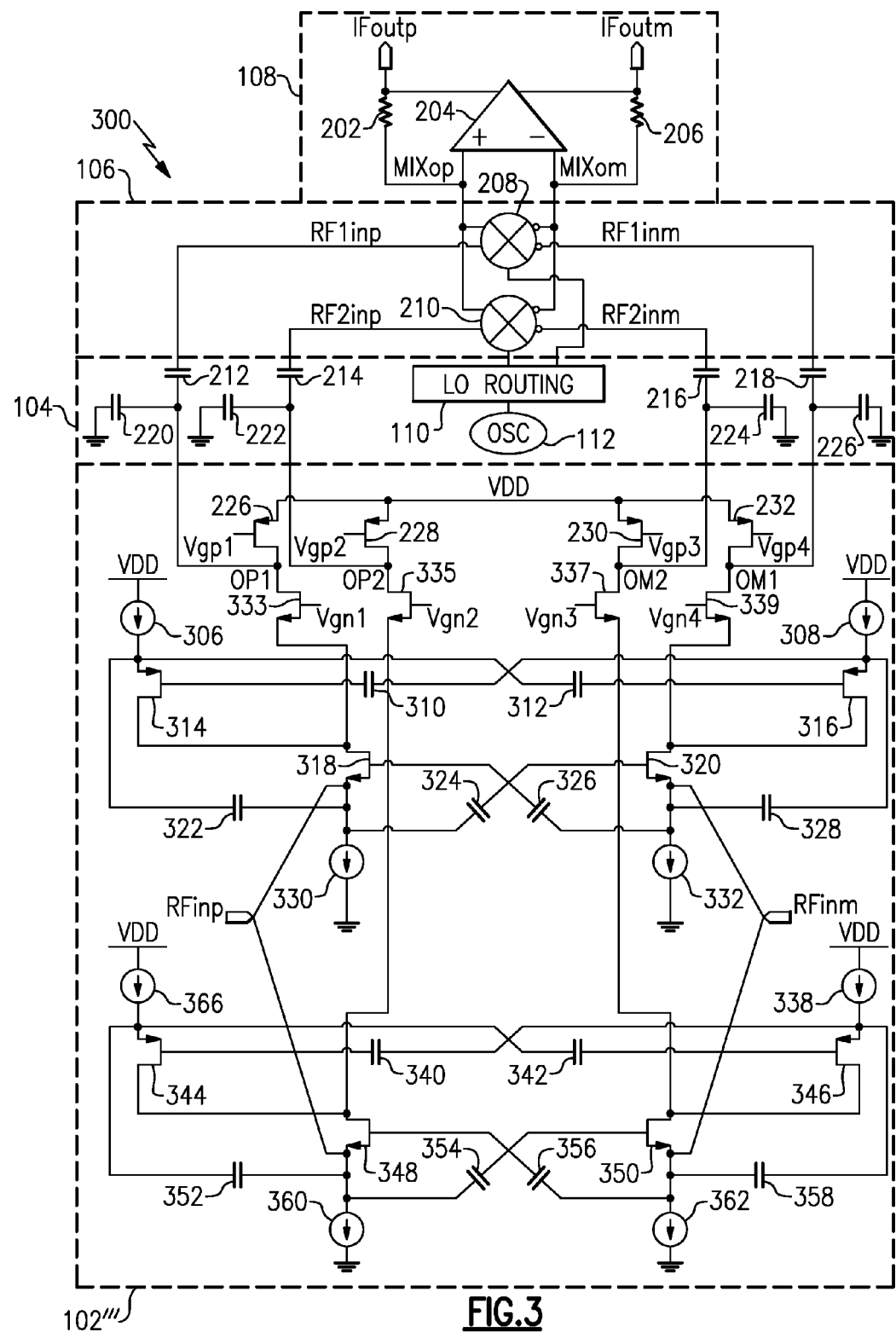
FIG. 3 is a schematic diagram of a receiver architecture that includes a split cascode low noise transconductance amplifier according to another embodiment.

FIG. 3 is a schematic diagram of a receiver architecture 300 that includes a split cascode low noise transconductance amplifier (LNTA) 102''' according to another embodiment. FIG. 3 is an alternative topology showing a split at the RF input pins. The LNTA 102''' includes an amplification circuit with separate cross coupled amplification transistors associated with different selection circuit. The LNTA 102''' uses approximately twice the number of components compared to the LNTA 102' of FIG. 2B. The amplification circuit of the LNTA 102''' includes a first section having an NFET 318, an NFET 320, a PFET 314, a PFET 316, a capacitor 310, a capacitor 312, a capacitor 324, a capacitor 326, a capacitor 322, a capacitor 328, and current sources 306, 308, 330, and 332. The connections and operation of the first section are similar to those of the amplification circuit of the split cascode LNTA 102' of FIG. 2B as described above. The amplification circuit of the LNTA 300 also includes a second section having an NFET 348, an NFET 350, a PFET 344, a PFET 346, a capacitor 340, a capacitor 342, a capacitor 354, a capacitor 356, a capacitor 352, a capacitor 358, and current sources 366, 338, 360, and 362. The connections and operation of the second section are also similar to those of the amplification circuit of the split cascode LNTA 102' of FIG. 2B as described above. Further, the devices and operation of the first section can be equivalent to those of the second section so as to provide differential symmetry.

The operation of the LNTA 300 of FIG. 3 is similar to that of the split cascode LNTA 102' of FIG. 2B except now the node Vxp and the node Vxm of FIG. 2B have been split into two independent branches with separate circuit elements. As illustrated in FIG. 3, there are two cascode branches associated with the RF input voltage RFinp, one from a drain of the NFET 348 and one from a drain of the NFET 318 to a source of the NFET 335 and a source of the NFET 333, respectively. The PFET 226, the PFET 228, the NFET 333, and the NFET 335 implement an embodiment of the first select circuit 101 of FIG. 2A. The operation of the select circuits of LNTA 102''' are similar to that of the select circuits of the split cascode LNTA 102' of FIG. 2B, except a source of the NFET 333 and a source of the NFET 335 do not connect. Instead, these sources are split to be part of independent branches. Also, there are two cascode branches, one from a drain of NFET 350 and one from a drain of the NFET 320 to a source of the NFET 339 and a source of the NFET 337, respectively. The PFET 230, the PFET 232, the NFET 337, and the NFET 339 implement an embodiment of the second select circuit 103 of FIG. 2A. The operation of the corresponding select circuit of LNTA 102''' is also similar to that of the select circuit of the split cascode LNTA 102' of FIG. 2B, except a source of the NFET 337 and a source of the NFET 339 do not connect. Instead, these sources are split to be part of independent branches.

FIG. 3 also illustrates an oscillator OSC 112 and a LO routing block 110. The oscillator 112 and LO routing block 110 can implement any suitable features of such blocks discussed herein.

As mentioned above, each independent branch can be associated with a separate mixer. One way to drive the separate mixers is to generate 50%, 25%, or 12.5% duty-cycle LO output signals. In some instances, one mixer can desire a signal derived from an odd division of the LO signal that is greater than 1. For instance, in a divide by 5 mode the output signal of a divider may have a duty cycle that is not 50%, such as a 40% duty cycle or a 60% duty cycle. Therefore, it can be desirable to provide a path for compensating the duty cycle of a LO signal for a divide by an odd division mode so that a signal having a 50% duty cycle can be generated. One solution can be to split the LO path into a separately enabled high band path and a low band path as further described below beginning with FIG. 4A.

Figure 4A:
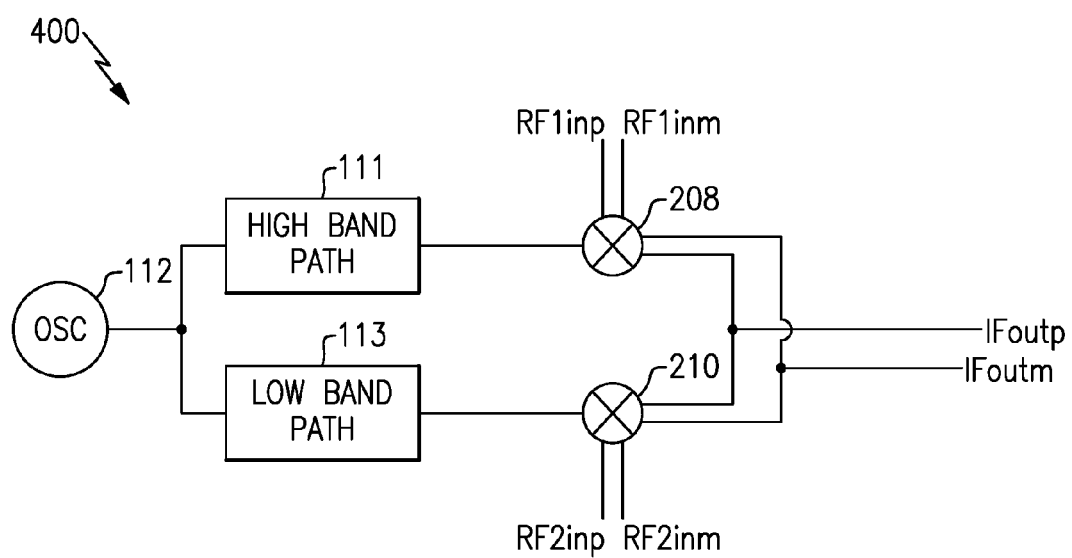
FIG. 4A is a schematic block diagram of a receiver system having separate local oscillator paths between an oscillator and different mixers in accordance with an embodiment.

FIG. 4A is a schematic block diagram of a receiver system 400 having separate local oscillator paths between an oscillator 112 and different mixers in accordance with an embodiment. The split local oscillator paths can provide I and Q quadrature signals for the mixers 208 and 210. The illustrated receiver system 400 includes an oscillator (OSC) 112, a high band path 111, a low band path 113, the mixer 208, and the mixer 210. When the receiver system 400 is in a high band mode, the high band path 111 is enabled. When the receiver system 400 is in a low band mode, the low band path 113 is enabled. In the high band mode, a processed signal from the local oscillator is provided to the mixer 208 to thereby enable the mixer 208. When enabled, the mixer 208 mixes RF signals of a higher frequency band received at the input ports RF1inp and RF1inm. In the low band mode, a processed signal from the local oscillator is provided to the mixer 210 to thereby enable the mixer 210. When enabled, the mixer 210 mixes RF signals of a lower frequency band received at the input ports RF2inp and RF2inm. The lower frequency band is lower than the high frequency band. As discussed in connection with FIGS. 2A-2D and FIG. 3, a first and a second output of the mixer 208 are connected with a first and a second output of the mixer 210. Only one of these mixers, either the mixer 208 or the mixer 210, is enabled at a time. The mixers 208 and 210 can be selectively enabled depending on a signal indicative of a mode of operation of the receiver system 400, such as a signal indicative of the receiver system 400 being in the high band mode or the low band mode. The first output of the mixers 208 and 210 provides a downconverted intermediate frequency output signal IFoutp and the second output of the mixers 208 and 210 provides the downconverted intermediate frequency output signal IFoutm. The intermediate frequency signals IFoutp and IFoutm can be differential signals.

Having separate high band and low band paths 111 and 113 can advantageously reduce overall power consumption and improve conversion gain relative to having a common signal path from the oscillator 112 to the mixers 208 and 210. In a particular example, the receiver system 400 can have a band of operation from about 169 MHz to about 960 MHz and the mixers 208 and 210 can receive 25% duty-cycle LO signals from LO paths to improve conversion gain through the mixers. In some instances, quadrature signals can be generated from a cascade of latches connected as a toggle flip-flop and then combinatorial logic can generate the 25% duty-cycle LO path outputs. In the example described above, when the RF input signal is in the low band mode associated with a frequency band centered around 169 MHz, then the LO output signal from the oscillator 112 can be routed through and processed by the low band path 113. The low band path 113 can divide the output signal frequency of the oscillator 112 by a positive odd integer divisor such as 5. Dividing by a positive odd divisor that is greater than one can cause the divided signal to have a duty cycle not equal to 50%. However, it can be desirable to use signals having 50% duty cycle as inputs for generating I and Q quadrature oscillator signals so that the I and Q quadrature signals can have a duty cycles that are proportional to 50%. For instance, it can be desirable to have I and Q quadrature signals that each has a duty cycle of one quarter or 25%. Therefore, the low band path 113 can divide the frequency of the output of the oscillator 112 by a positive odd integer divisor to convert the output signal of the oscillator 112 to have a desired frequency and then correct the duty cycle of the divided signal to be 50%. In addition, the low band path 113 can enable the receiver system 400 to operate with improved blocking and noise performance relative to a similar receiver system having a single path between the oscillator 112 and mixers 208 and 210.

In the high band mode, for instance when the RF input signal is in the 960 MHz band, the high band path 111 is enabled and the output of the oscillator 112 is routed through and processed by the high band path 111. The high band path 111 can divide the output of the oscillator 112 by a positive even integer divisor for generating the I and Q quadrature signals for the mixer 208. When the divisor is even, the functionality of the high band path 111 can be less complex than that of the low band path 113. The high band path 111 can use relatively simpler circuitry to generate I and Q quadrature signals with a duty cycle in proportion to one half because dividing frequency by an even divisor more naturally leads to generating signals having 50% duty cycles. Alternatively or additionally, the high band path 111 as illustrated can process the output of the oscillator 112 without dividing the output of the oscillator 112 in frequency.

Advantageously, by splitting the LO path into separately enabled high band and low band paths 111 and 113, respectively, a reduction in parasitics associated with the high band LO path can be achieved relative to a single LO path. This can in turn reduce loading and lower power dissipation by relaxing high speed buffering specifications. Additionally, having a low band path 113 and a high band path 111 can allow for physical layouts that can reduce the LNTA/Mixer interface parasitics.

Figure 4B:
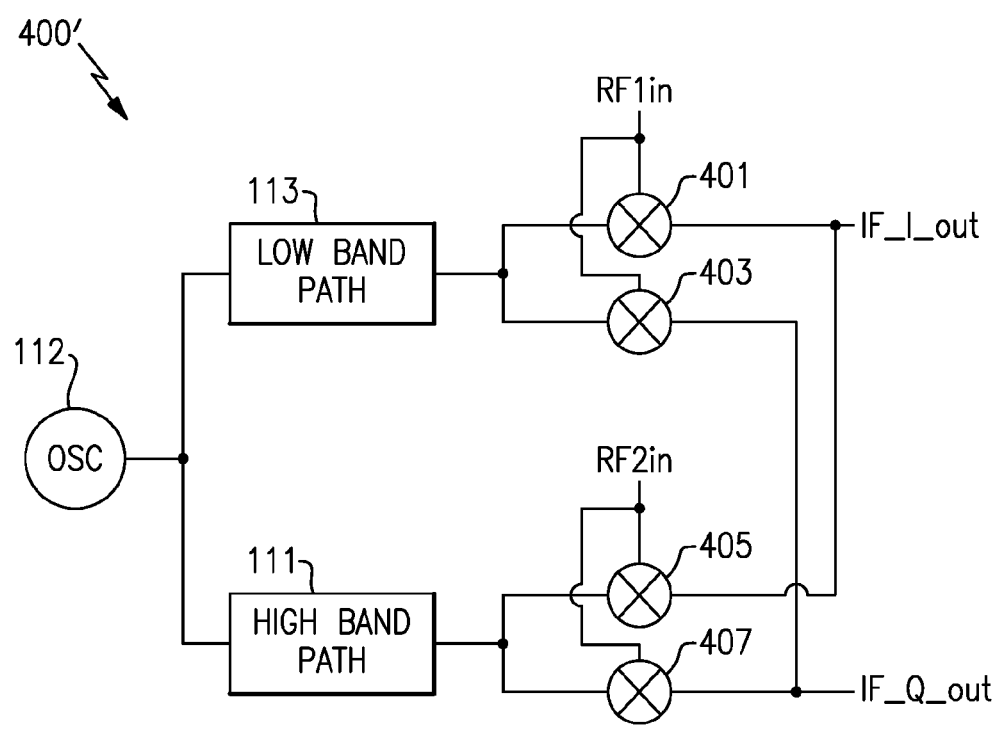
FIG. 4B is a schematic block diagram of a receiver system having separate local oscillator paths between an oscillator and different mixers in accordance with another embodiment.

FIG. 4B is a schematic block diagram of a receiver system 400' having separate local oscillator paths between an oscillator 112 and different mixers in accordance with another embodiment. The receiver system 400' is similar to the receiver system 400 of FIG. 4A except the receiver 400' includes an I-channel mixer 401 and a Q-channel mixer 403 in place of the mixer 210 of FIG. 4A, and the receiver 400' includes an I-channel mixer 405 and a Q-channel mixer 407 in place of the mixer 208 of FIG. 4A.

As shown in FIG. 4B, the high band path 111 provides a local oscillator signal to an input of the I-channel mixer 405 and the Q-channel mixer 407 for mixing with an RF input signal RF1in, and the low band path 113 provides a local oscillator signal to an input of the I-channel mixer 401 and the Q-channel mixer 403 for mixing with an RF input signal RF2in. An output of the I-channel mixer 401 and an output of I-channel mixer 405 are electrically connected to each other to provide an intermediate I-channel frequency signal IF_I_out, and an output of the Q-channel mixer 403 and an output of Q-channel mixer 407 are electrically connected to each other to provide an intermediate Q-channel frequency signal IF_Q_out.

Figure 4C:
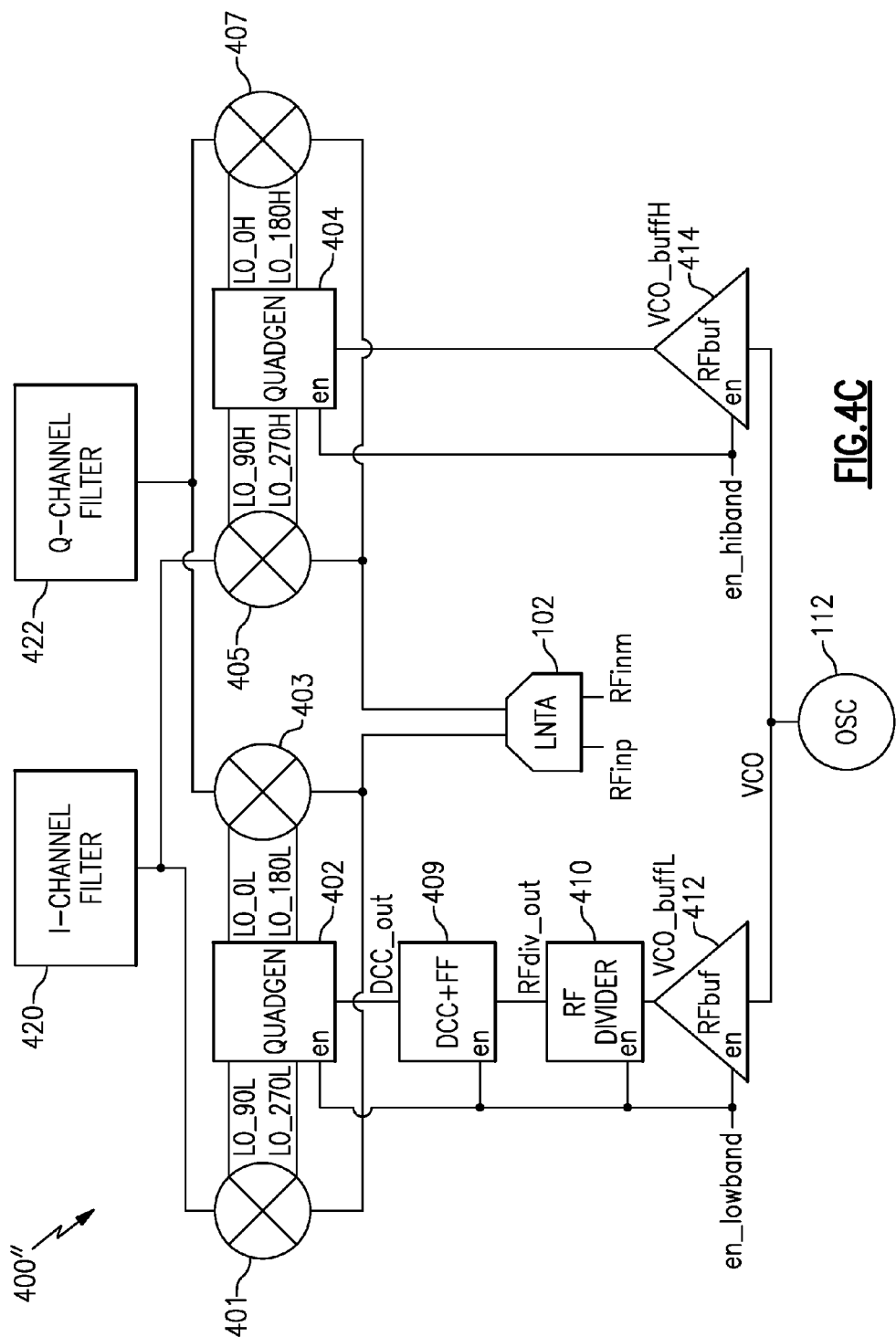
FIG. 4C is a system block diagram of a receiver system having split local oscillator paths in accordance with an embodiment.

FIG. 4C is schematic block diagram of a receiver system 400" having split local oscillator paths in accordance with the teachings herein. The illustrated receiver system 400" includes the oscillator 112, the LNTA 102, the I-channel mixers 401 and 405, the Q-channel mixers 403, and 407, channel filters 420 and 422, a low band path between the oscillator 112 and the mixers 401 and 403, and a high band path between the oscillator 112 and the mixers 405 and 407. The low band path of the receiver system 400" includes an RF buffer 412, an RF divider 410, a duty cycle correction (DCC) circuit 409, and an IQ quadrature generation circuit 402. This low band path is an illustrative embodiment of the low band path 113 of FIG. 4A. The high band path of the receiver system 400" includes an RF buffer 414 and an IQ quadrature generation module 404. This high band path is an illustrative embodiment of the high band path 111 of FIG. 4A.

The low band path can be enabled by a low band enable signal en_lowband. As shown in FIG. 4C, the RF buffer 412, the RF divider 410, the DCC circuit 409, and the IQ quadrature generation circuit 402 each have an enable input port that receives the low band enable signal en_lowband to enable these circuits.

In the low band path, the RF buffer 412 is configured to receive an output of the oscillator 112 and an output VCO_buffL of the RF buffer 412 is connected to an input of the RF divider 410. The oscillator 112 can be any suitable voltage-controlled oscillator or any other suitable circuit configured to generate an oscillator signal. In FIG. 4C, the oscillator 112 is implemented by a voltage controlled oscillator and provides an output VCO. The LO output VCO of FIG. 4C has a sinusoidal waveform. The RF buffer 412 is configured to receive the sinusoidal LO output VCO and to provide a square wave as the output VCO_buffL. The RF buffer 412 is enabled by the low band enable signal en_lowband. The RF buffer 412 of the low band path and the RF buffer of the high band path 414 can be enabled in a mutually exclusive fashion.

The RF divider 410 can divide down the frequency of the LO output VCO. The division ratio can be selectable. For example, the division ration can be selected to be 2, 4, or 5 in certain implementations. In a divide by 5 mode (or in another mode that divides by a positive odd integer divisor that is greater than 1), a relatively low-power RF divider 410 can generate a non 50% duty cycle output. For instance, the output of the RF divider 410 can have a duty cycle of 40% in a divide by 5 mode, as will be discussed with reference to FIG. 4D.

An output of the RF divider 410 is connected to an input of the DCC circuit 409. To generate accurate outputs having a 25% duty cycle, it can be advantageous to provide the IQ quadrature generation circuit 402 with an input having a 50% duty cycle. Otherwise, lower phase accuracy from the IQ quadrature generation circuit 402 can result in a degraded image attenuation in the receiver system 400". The DCC circuit 409 can receive the output RFdiv_out from the RF divider 410 that has a non 50% duty cycle (e.g., a 40% duty cycle) and provide an output DCC_out having a 50% duty cycle. This adjustment in duty cycle can be implemented using relatively straightforward combination logic implemented by digital circuits. The DCC circuit 409 can also include a flip-flop or other state element to re-time the output DCC_out based on the output VCO of the oscillator 112. For instance, such re-timing of the output DCC_out can be implemented using the output VCO_buffL of the RF buffer 412. This re-timing can achieve relatively good phase-noise performance, which can result in desirable RF blocking performance in the receiver system 400". The re-timing can reduce or eliminate phase noise introduced by the RF divider 410 on its output signal RFdiv_out.

Figure 5:
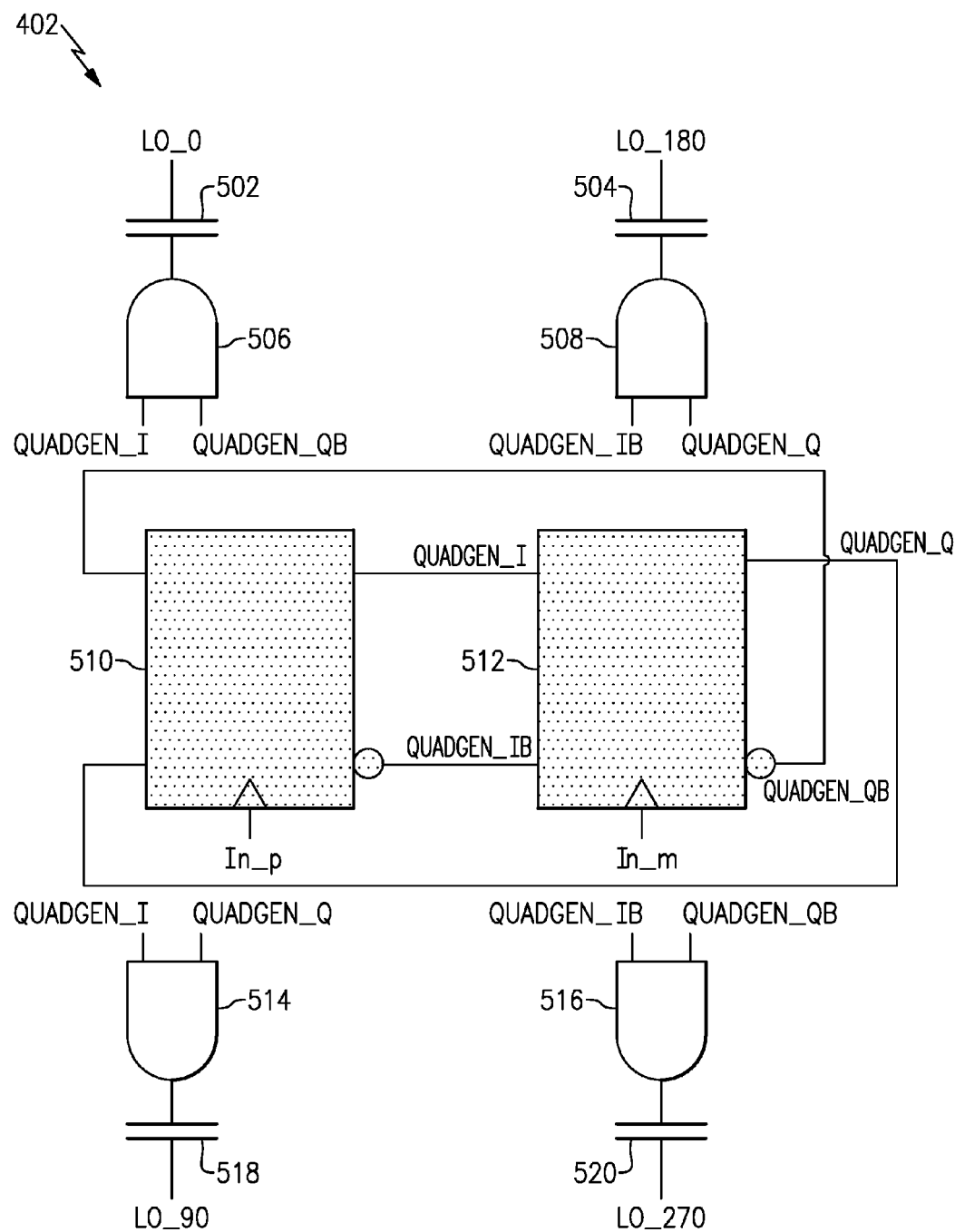
FIG. 5 is a schematic diagram of a circuit for generating local oscillator quadrature phases of a mixer according to an embodiment.

An output of the DCC circuit 409 is connected to an input of the IQ quadrature generation circuit 402. The IQ quadrature generation circuit 402 can receive an input having a 50% duty cycle and provide 4 output signals each having a 25% duty cycle. Such outputs can be substantially non-overlapping. The quadrature generation circuits discussed herein can be referred to as 25% duty cycle generators or as 25% duty cycle circuits. The IQ quadrature generation circuit 402 is an illustrative example of a duty cycle reduction circuit that can receive an input having a 50% duty cycle and reduce that duty cycle by a positive even divisor. As another example, a duty cycle reduction circuit can receive an input having a 50% duty cycle and provide outputs each having a 12.5% duty cycle. While embodiments discussed herein refer to quadrature generation circuits, any suitable duty cycle reduction circuit can be implemented in place of such quadrature generation circuits and/or in accordance with the principles and advantages discussed herein. An illustrative example of the IQ quadrature generation circuit 402 is shown in FIG. 5. More details of the IQ quadrature generation circuit 402 will be discussed in connection with FIG. 5.

In the high band path, an output VCO_buffH of the RF buffer 414 is connected to an input of the IQ quadrature generation circuit 404. In the receiver system 400", the RF buffer 414 is configured to receive the sinusoidal LO output VCO and to provide a square wave as the output VCO_buffH. As shown in FIG. 4C, the RF buffer 414 and the IQ quadrature generation circuit 404 each have an enable input port which receives a high enable band signal en_hiband. Only one of the high band enable signal en_hiband or the low band enable signal en_lowband can be asserted at a time. Accordingly, when one of the high band path or the low band path is enabled the other of these paths can be disabled.

The illustrated receiver system 400" includes the I-channel mixer 401 and the Q-channel mixer 403 that implement I and Q quadrature component mixers, respectively, of the receiver system 400". The mixer 210 of FIG. 4A can correspond to one of the mixers 401 or 403. It will be understood that the principles and advantages discussed with reference to FIG. 4A, the LTNA embodiments, and other disclosure discussed herein can be implemented in IQ receivers. The receiver system 400" also includes the I-channel mixer 405 and the Q-channel mixer 407 that implement I and Q quadrature component mixers, respectively. Also as shown in FIG. 4C, the receiver system 400" includes an I channel filter 420 and a Q-channel filter 422.

The receiver system 400" includes the LNTA 102 that converts the RF voltage input signals RFinp and RFinm to differential RF current signals provided at a first output and a second output of the LNTA 102. The LNTA 102 of FIG. 4C can implement any of the principles and advantages of the LTNAs discussed herein. As illustrated in FIG. 4C, the first output of the LNTA 102 is connected to an input of the I-channel mixer 401 and to an input of the Q-channel mixer 403 and a second output of the LNTA 102 is connected to an input of the I-channel mixer 405 and to an input of the Q-channel mixer 407. In certain embodiments (similar to the embodiment illustrated in FIG. 7), the LNTA 102 can include a plurality of outputs to each of the mixers 401, 403, 405, and 407 in which the plurality of outputs each correspond to a separate current path of the LNTA 102 and corresponding coupling capacitor, for example, as discussed above in connection with certain embodiments.

When the RF voltage input signals RFinp and RFinm are signals of a low frequency band, the receiver system 400" operates in the low band mode. During the low band mode, the en_lowband signal is asserted to enable the low band path and the en_hiband signal is de asserted to disable (does not enable) the high band path. In FIG. 4C, RF current signals from the first and second outputs of the LNTA 102 are routed to the mixers 401, 403, 405, and 407. However, only the mixers 401 and 403 are active during the low band mode. As will be discussed below, the mixers 401 and 403 can be active at different times during the low band mode. By design, the mixers 405 and 407 should not load or degrade the performance of the low band path.

The output of the oscillator 112 is provided to the RF buffer 412, which is configured to amplify and provide a buffered VCO signal VCO_buffL to the RF divider 410. The RF divider 410 can divide the frequency of the buffered VCO signal VCO_buffL by a division ratio, which can be an odd divisor such as 5, and can provide the divider output RFdiv_out to the DCC circuit 409. The RF divider 410 can have an adjustable division ratio. In certain embodiments, the RF divider 410 can divide its input in frequency by a positive odd divisor that is greater than one in one state and divide its input in frequency by a positive even divisor in another state. When the RF divider 410 divides its input in frequency by a positive even divisor, the RF divider can provide the divider output RFdiv_out to the quadrature generation circuit 402 to bypass the DCC circuit 409 according to certain embodiments.

Dividing by an odd divisor, such as 5, can cause the duty cycle of the divider output RFdiv_out to not be equal to 50%. The DCC circuit 409 can correct the duty cycle of the divider output RFdiv_out and provide a duty cycle corrected output DCC_out having a duty cycle of 50% or approximately 50%. The duty cycle corrected output DCC_out is received by the IQ quadrature generation circuit 402, which can generate low band quadrature LO signals LO_0L, LO_90L, LO_180L, and LO_270L for the mixer 401 and the mixer 403. The low band quadrature LO signals LO_0L, LO_90L, LO_180L, and LO_270L can have a 25% duty cycle and provide the appropriate frequency for mixing with the RF current signals at the first and second outputs of the LNTA 102. The output of the mixer 401 and the output of the mixer 403 connect to the I-Channel filter 420 and the Q-Channel filter 422, respectively.

When the RF voltage input signals RFinp and RFinm are signals of a high frequency band having a higher frequency than the low frequency band, the receiver system 400" operates in the high band mode. During the high band mode, the high band enable signal en_hiband enables the high band path and the low band enable signal en_lowband disables (does not enable) the low band path. RF current signals from the first and second outputs of the LNTA 102 are routed to the mixers 401, 403, 405, and 407. However, only the mixers 405 and 407 are active during the high band mode. As will be discussed below, the mixers 405 and 407 can be active at different times during the high band mode. By design the mixers 401 and 403 should not load or degrade the performance of the high band path.

The output VCO of the oscillator 112 is provided to the RF buffer 414, which is configured to amplify and provide a buffered VCO signal VCO_buffH to the IQ quadrature generation circuit 404. The IQ quadrature generation circuit 404 can generate high band quadrature signals LO_0H, LO_90H, LO_180H, and LO_270H for the mixer 405 and the mixer 407. The high band quadrature signals LO_0H, LO_90H, LO_180H, and LO_270H can each have a 25% duty cycle and provide the appropriate frequency for mixing with the RF current signals at the first and second outputs of the LNTA 102. The output of the mixer 405 and the output of the mixer 407 connect to the I-Channel filter 420 and the Q-Channel filter 422, respectively.

Figure 4D:
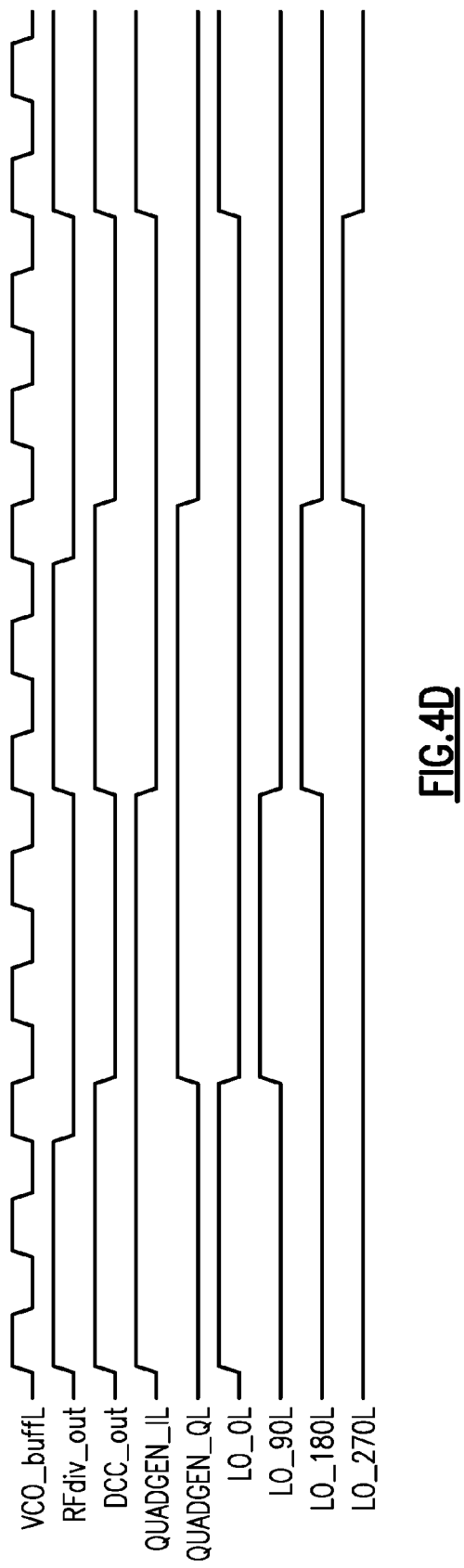
FIG. 4D shows signal waveforms of the receiver system of FIG. 4C in the low band path during the low band mode.

FIG. 4D shows signal waveforms of the receiver system 400" of FIG. 4C in the low band path during the low band mode. The output waveform of the RF buffer 412 is labelled VCO_buffL. The output VCO_buffL of the RF buffer 412 is a squared version of the output VCO of the oscillator 112. With reference to FIG. 4C, the waveforms shown in FIG. 4D correspond to when the RF input signals RFinp and RFinm are of a low frequency band such that the low band enable signal en_lowband enables the RF buffer 412, the RF divider 410, the DCC circuit 409, and the IQ quadrature generation circuit 402. As shown in FIG. 4D, the RF divider 410 can divide the frequency of the output VCO_buffL from the RF buffer 412 by an odd divisor (e.g., 5 in FIG. 5) as shown by the waveform of the divider output RFdiv_out. As shown in FIG. 4D, the divider output RFdiv_out can have a 40% duty cycle. More generally, using a relatively low power RF divider 410 to implement an odd divide can result in a divider output RFdiv_out having a non 50% duty cycle.

The divider output RFdiv_out is then provided by the RF divider 410 to the DCC circuit 409. The DCC circuit 409 can condition the duty cycle of the divider output RFdiv_out and provide the duty cycle corrected output DCC_out having a desired 50% duty cycle. The duty cycle corrected output DCC_out is then applied to the IQ quadrature generation circuit 402 where it is further divided to generate a signal QUADGEN_IL and a signal QUADGEN_QL (not shown in FIG. 4C). The signal QUADGEN_IL and the signal QUADGEN_QL can be decomposed to provide the low band quadrature signals LO_0L, LO_90L, LO_180L, and LO_270L that have a 25% duty cycle as shown. Although the embodiment of FIG. 4C shows the mixers 401 and 403 as receiving the low band quadrature signals LO_0L, LO_90L, LO_180L, and LO_270L, other configurations are possible. For instance, the mixers 401 and 403 could instead be configured to use oscillator signals such as the QUADGEN_IL and QUADGEN_QL signals having 50% duty cycle or signals derived therefrom by dividing by a positive even integer divisor that is greater than 2. In FIG. 4D, the signals ending in "L" can denote that these are signals for the low band path instead of the high band path. Such signals can be active high or active low signals depending on a desired implementation.

Figure 4E:
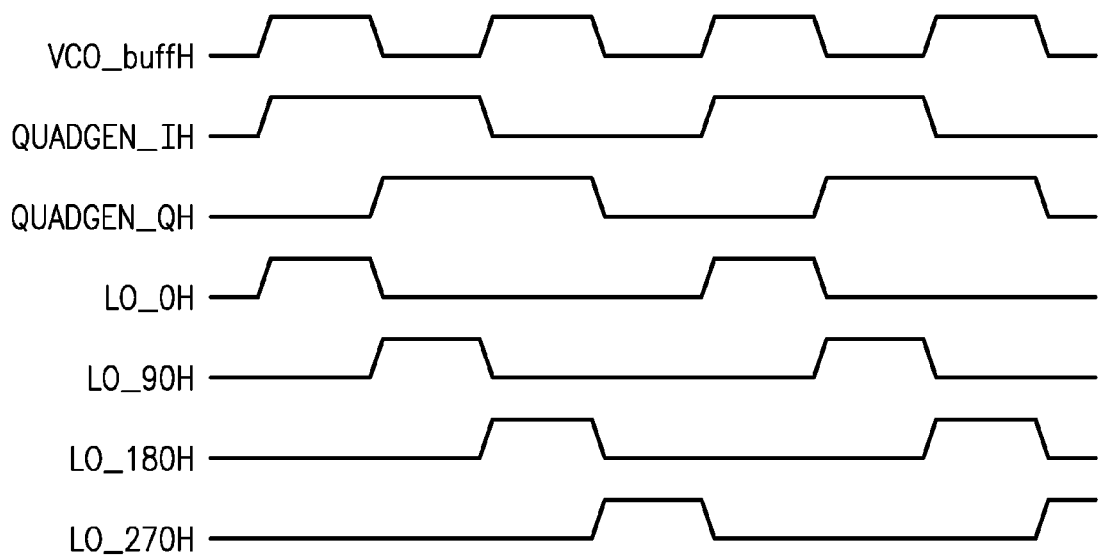
FIG. 4E shows signal waveforms of the receiver system of FIG. 4C in the high band path when the high band path is enabled.

FIG. 4E shows signal waveforms of the receiver system 400" of FIG. 4C in the high band path when the high band path is enabled. The output VCO_buffH from the RF buffer 414 is shown as the top waveform. The waveforms shown in FIG. 4E correspond to when the RF input signals RFinp and RFinm are of a high frequency band such that the en_hiband signal enables the RF buffer 414 and the IQ quadrature generation circuit 404. In the embodiment illustrated in FIG. 4C, the output VCO_buffH is provided directly from the RF buffer 414 to the IQ quadrature generation circuit 404, which generates a signal QUADGEN_IH and a signal QUADGEN_QH (not shown in FIG. 4C). The high band quadrature signals LO_0H, LO_90H, LO_180H, and LO_270H having a 25% duty cycle are generated from the QUADGEN_IH and QUADGEN_QH signals. Although the embodiment of FIG. 4C shows the mixers 405 and 407 as receiving the high band quadrature signals LO_0H, LO_90H, LO_180H, and LO_270H, other configurations are possible. For instance, the mixers 405 and 407 could instead be configured to use oscillator signals such as the QUADGEN_IH and QUADGEN_QH signals having 50% duty cycle or signals derived therefrom by dividing by a positive even integer divisor that is greater than 2. In FIG. 4E, the signals ending in "H" can denote that these are signals for the high band path instead of the low band path. Such signals can be active high or active low signals depending on a desired implementation.

FIG. 5 is a schematic diagram of an IQ quadrature generation circuit 402 for generating local oscillator quadrature phases of a mixer according to an embodiment. The IQ quadrature generation circuit 404 can also be implemented using the principles and advantages discussed with reference to FIG. 5. The IQ quadrature generation circuit 402 includes a latch 510, a latch 512, an AND gate 506, an AND gate 508, an AND gate 514, an AND gate 516, a capacitor 502, a capacitor 504, a capacitor 514, and a capacitor 516. The latch 510 receives a clock signal in_p and the latch 512 receives a clock signal in_m. The inputs to the latches 510 and 512 can correspond to the output of the DCC circuit 409 for the IQ quadrature generation circuit 402. In the IQ quadrature generation circuit 404, the inputs to the latches can correspond to the output VCO_buffH of the RF buffer 414. In FIG. 5, the latches 510 and 512 are arranged in a divide by two mode in which their outputs have a frequency that is half of their inputs. As connected, the latch 510 provides outputs QUADGEN_I and QUADGEN_IB, which are logical complements of each other. The latch 512 provides outputs QUADGEN_Q and QUADGEN_QB, which are logical compliments of each other. As shown in FIG. 5, the AND gates 506, 508, 514, and 516 decode the QUADGEN_I, QUADGEN_IB, QUADGEN_Q, and QUADGEN_QB signals to generate the 25% duty cycle signals LO_0, LO_90, LO_180, and LO_270 when the inputs to the latches 510 and 512 have a 50% duty cycle. More generally, the outputs LO_0, LO_90, LO_180, and LO_270 can have a duty cycle that is half of the duty cycle of the inputs in_p and in_m. Also as shown, the capacitors 502, 504, 514, and 516 can provide filtering and coupling at the outputs of the AND gates 506, 508, 514, and 516, respectively.

Figure 6:
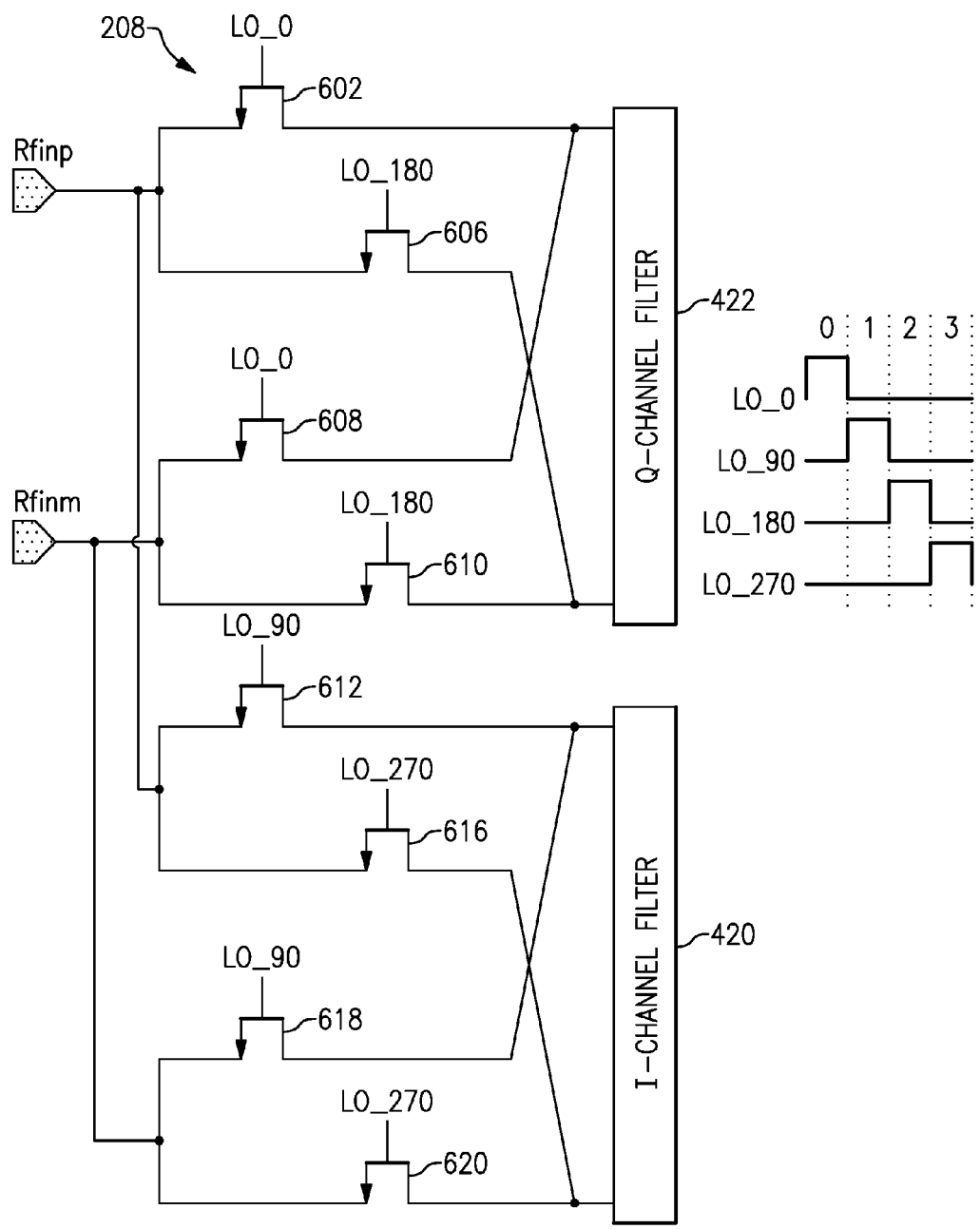
FIG. 6 is a schematic diagram of a mixer according to an embodiment.

FIG. 6 is a schematic diagram of IQ mixers 600 and corresponding channel filters according to an embodiment. The mixers 600 can be implemented in connection with any of the LTNAs discussed herein and/or any of the LO paths discussed herein. For instance, the IQ mixers 600 can correspond to the mixers 401 and 403 of FIG. 4C or the mixers 405 and 407 of FIG. 4C. The illustrated IQ mixers 600 are passive mixers. As shown in FIG. 6, the IQ mixers include a plurality of field effect transistors including an NFET 602, an NFET 606, an NFET 608, an NFET 610, an NFET 612, an NFET 616, an NFET 618, and an NFET 620. The NFETs 602, 606, 608, and 610 can correspond to the mixer 401 of FIG. 4C. The NFETs 612, 616, 618, and 620 can correspond to the mixer 403 of FIG. 4C. The I path outputs of the IQ mixers 600 can be filtered by the I-channel filter 420 and the Q oat outputs of the IQ mixers 600 can be filtered by the Q-channel filter 422.

As discussed with respect to FIG. 4C, the mixers 401, 403, 405, and 407 use the signals from the low band path or the high band path corresponding to LO_0, LO_90, LO_180, and LO_270 of FIG. 6 to downconvert the RF input signals RFinp and RFinm into IF signals having I and Q quadrature components. The IQ mixers 600 can have 4 phases, phases 0 to 3, and the LO signals LO_0, LO_90, LO_180, and LO_270 can be non-overlapping as indicated by the waveform of FIG. 6. These LO signals can be provided by an IQ quadrature generation circuit, such as the IQ quadrature generation circuit 402 of FIG. 5. With non-overlapping LO signals as illustrated by the waveforms of FIG. 4D, 4D, or 6, only one field effect transistor connected to each input RFinp and RFinm is ON per phase. Accordingly, only one path from each input RFinp and RFinm to a respective is ON at a time. This should result in about a 3 dB improvement in gain relative to certain implementations with overlapping LO signals.

Figure 7:
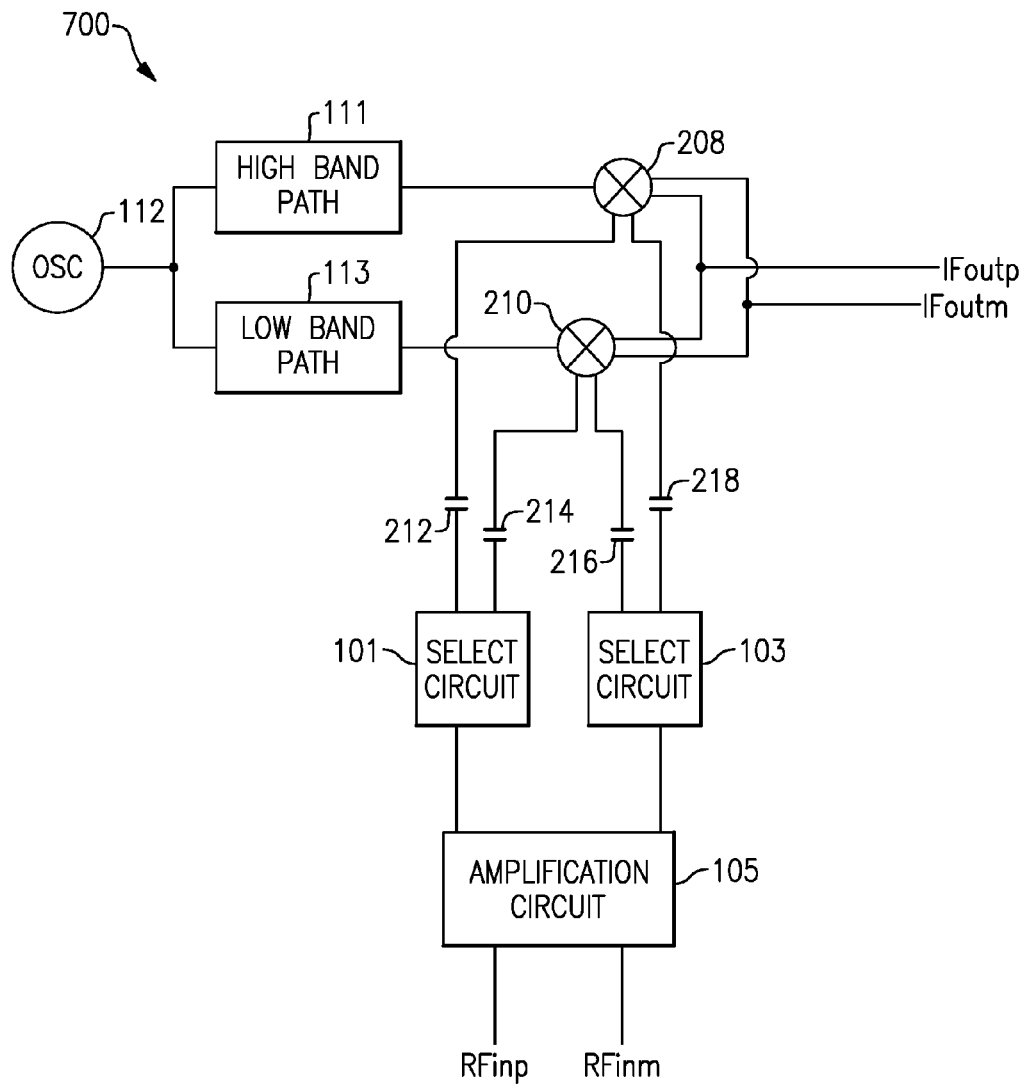
FIG. 7 is a system diagram showing a receiver architecture with an LNTA with separate current paths and LO routing that includes separate local oscillator signal paths in accordance with the teachings herein.

FIG. 7 is a system diagram of a receiver architecture 700 with an LNTA with separate current paths and LO routing that includes separate local oscillator signal paths in accordance with the teachings herein. As shown in FIG. 7, features of the embodiments of FIG. 2A and FIG. 4A can be combined. More generally, any of the principles and advantages of the LNTAs discussed herein can be implemented in connection with any of the principles and advantages of the LO paths discussed herein.

The receiver architecture 700 of FIG. 7 includes the amplification circuit 105, the first select circuit 101, the second select circuit 103, the capacitor 212, the capacitor 214, the capacitor 216, the capacitor 218, the oscillator 112, the high band path 111, the low band path 113, the mixer 208, and the mixer 210. Such features can be implemented in connection with an I path and a Q path. Operation and connectivity of the receiver architecture 700 can be similar to the embodiments discussed above combined together. The amplification circuit 105 can convert the RF voltage input signal RFinp and RFinm into RF current signals. When the RF voltage input signals are of a high frequency band indicating a high band mode, the first select circuit 101 and the second select circuit 103 can couple the RF current signals from the amplification circuit 105 through the capacitor 212 and the capacitor 218, respectively, to the mixer 208. When the RF voltage input signals are of a low frequency band that is lower than the high frequency band and indicating a low band mode, the first select circuit 101 and the second select circuit 103 can couple the RF current signals from the amplification circuit 105 through the capacitor 214 and the capacitor 216, respectively, to the mixer 210.

The local oscillator output signal from the oscillator 112 is enabled through the high band path 111 in the high band mode so as to allow duty cycle adjustment to a LO signal frequency divided by an odd divisor. The duty cycle adjustment can advantageously provide an output having a 50% duty cycle, which can be used to generate I and Q quadrature mixer signals having duty cycles in proportion to one half of the duty cycle adjustment circuit output for the mixer 208. The local oscillator signal from the oscillator 112 is enabled through the low band path module 113 in the low band mode to be provided to the mixer 210 by way of less processing circuitry.

Applications

Devices employing any of the above described transconductance amplifiers and/or LO paths can be implemented into various electronic devices. Examples of the electronic devices can include, but are not limited to, consumer electronic products, parts of the consumer electronic products such as packaged electronic components, electronic components in Internet Of Things (IOT) applications, electronic test equipment, cellular communications infrastructure, etc. Examples of the electronic devices can also include circuits of optical networks or other communication networks. The consumer electronic products can include, but are not limited to, wireless metering devices (e.g., wireless gas metering, wireless water metering, wireless electricity metering), wireless sensor nodes, a cellular phone such as a smart phone, a portable computing device, a laptop computer, a computing system including desktop computer or server, a wearable computing device (e.g., a smart watch), a vehicular electronics system such as an automotive electronics system, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more.

Although the inventions have been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined by reference to the appended claims.

What is claimed is:

1. An apparatus comprising:
    a transconductance amplifier comprising split cascode current paths, the split cascode current paths comprising a first current path from a cascode node to a first output and a second current path from the cascode node to a second output, and the transconductance amplifier is configured to receive a radio frequency (RF) input voltage, provide an RF output current to the first output in a first state, and provide the RF output current to the second output in a second state, wherein the transconductance amplifier is configured to operate in the first state at a different time than the second state;
    mixers comprising a first mixer and a second mixer; and
    a capacitance circuit comprising a first capacitor and a second capacitor, the first capacitor electrically coupled between the first output of the transconductance amplifier and an input of the first mixer, and the second capacitor electrically coupled between the second output of the transconductance amplifier and an input of the second mixer, the first capacitor and the second capacitor having different capacitances.

2. The apparatus of claim 1, wherein the transconductance amplifier comprises a cross-coupled common gate amplifier.

3. The apparatus of claim 2, wherein the cross-coupled common gate amplifier comprises a first field effect transistor cross-coupled with a second field effect transistor, and wherein the cascode node is at a drain of the first field effect transistor.

4. The apparatus of claim 2, wherein:
    the mixers further comprise a third mixer and a fourth mixer,
    the cascode node is at a terminal of a first transistor of the cross-coupled common gate amplifier, and
    the transconductance amplifier further comprises a second cascode node at a terminal of a second transistor of the cross-coupled common gate amplifier in which the second transistor is cross-coupled with the first transistor, and
    the transconductance amplifier is configured to provide a second RF output current from the second cascode node to an input of the third mixer in the first state, and provide the second RF output current from the second cascode node to an input of the fourth mixer in the second state.

5. The apparatus of claim 1, wherein the cascode node has a low impedance relative to other nodes of the transconductance amplifier.

6. The apparatus of claim 1, wherein the first state is associated with lower frequencies of the RF input voltage than the second state, and wherein the capacitance of the first capacitor is greater than the capacitance of the second capacitor.

7. The apparatus of claim 1, wherein the first mixer is configured to downconvert a frequency of the RF output current by a different amount in the frequency domain than the second mixer, and wherein the first mixer and the second mixer provide approximately the same signal gain.

8. The apparatus of claim 1, wherein the apparatus comprises a receiver having a high band to low band frequency ratio of at least 4, the receiver comprising the transconductance amplifier, the mixers, and the capacitance circuit.

9. The apparatus of claim 8, wherein the first state is associated with the RF input voltage having a frequency in at least one of a 169 MHz frequency band or a 433 MHz frequency band, and wherein the second state is associated with the RF input voltage having a frequency in at least one of a 868 MHz frequency band or a 900 MHz frequency band.

10. The apparatus of claim 1, wherein the transconductance amplifier is configured to change state responsive to a control signal that is indicative of a frequency of the RF input voltage.

11. An apparatus comprising:
    a transconductance amplifier comprising:
        an amplification circuit configured to receive a radio frequency input voltage and provide a radio frequency current; and
        a select circuit configured to receive the radio frequency current from the amplification circuit and to provide the radio frequency current to a selected output responsive to a control signal, wherein the selected output is a first output in a first state, and wherein the selected output is a second output in a second state;
    a capacitance circuit comprising a first capacitor electrically coupled to the first output of the select circuit and a second capacitor electrically coupled to the second output of the select circuit, the first capacitor and the second capacitor having different capacitances; and
    mixers comprising a first mixer and a second mixer, the first mixer having an input electrically connected to first output of the select circuit by way of the first capacitor, and the second mixer having an input electrically coupled to the second output of the select circuit by way of second capacitor.

12. The apparatus of claim 11, wherein the select circuit is configured to change state responsive to a control signal, the control signal being indicative of a frequency of the radio frequency input voltage.

13. The apparatus of claim 11, wherein the first state is associated with a lower frequency of the radio frequency input voltage than the second state, and wherein the capacitance of the first capacitor is greater than the capacitance of the second capacitor.

14. The apparatus of claim 11, wherein the amplification circuit comprises a cross-coupled common gate amplifier.

15. The apparatus of claim 11, wherein the select circuit is electrically connected to a cascode node having a low impedance relative to other nodes of the amplification circuit.

16. An electronic system comprising:
mixers comprising a first mixer and a second mixer;
a low-noise transconductance amplifier comprising split cascode current paths, wherein the low-noise transconductance amplifier is configured to provide a radio frequency (RF) output current to the first mixer by way of a first coupling capacitor in a first state of the electronic system, wherein the low-noise transconductance amplifier is configured to provide the RF output current to the second mixer by way of a second coupling capacitor in a second state of the electronic system, wherein the electronic system is configured to operate in the first state and the second state at different times, and wherein the first capacitor and the second capacitor have different capacitances; and
an oscillator routing block comprising a first path between an oscillator and the first mixer and a second path between the oscillator and the second mixer, the oscillator routing block configured to receive an oscillator signal from the oscillator, enable the first path in the first state of the electronic system, and enable the second path in the second state of the electronic system.

17. The electronic system of claim 16, wherein the first path of the oscillator routing block is a low band path and the second path of the oscillator block is a high band path, and wherein the first state of the electronic system is a low band state and the second state of the electronic system is a high band state.

18. The electronic system of claim 16, wherein the first path of the oscillator routing block comprises:
a radio frequency divider configured to divide the oscillator signal by a positive odd integer divisor that is greater than one; and
a duty cycle correction circuit configured to receive an output from the radio frequency divider and to provide an output having a duty cycle that is closer to 50% than the output from the radio frequency divider.

19. The electronic system of claim 18, wherein the first path of the oscillator routing block comprises a duty cycle reduction circuit electrically coupled between the duty cycle correction circuit and the first mixer, the duty cycle reduction circuit configured to receive the output of the duty cycle correction circuit and to provide an output having a duty cycle that corresponds to the duty cycle of the output of the duty cycle correction circuit divided by a positive even integer.

20. The electronic system of claim 16, further comprising an I channel filter and a Q channel filter, and wherein the first mixer is electrically coupled to an input of the I channel filter and the second mixer is electrically coupled to an input of the Q channel filter.

* * * * *